(12) United States Patent
Sheperek et al.

(10) Patent No.: US 11,309,020 B2
(45) Date of Patent: *Apr. 19, 2022

(54) DRAGGING FIRST PASS READ LEVEL THRESHOLDS BASED ON CHANGES IN SECOND PASS READ LEVEL THRESHOLDS

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/112,755

(22) Filed: Dec. 4, 2020

(65) Prior Publication Data

US 2021/0183439 A1 Jun. 17, 2021

Related U.S. Application Data

(63) Continuation of application No. 16/295,829, filed on Mar. 7, 2019, now Pat. No. 10,885,975.

(51) Int. Cl.
*G11C 16/04* (2006.01)
*G11C 11/56* (2006.01)
*G11C 5/04* (2006.01)

(52) U.S. Cl.
CPC ............ *G11C 11/5628* (2013.01); *G11C 5/04* (2013.01); *G11C 11/5642* (2013.01); *G11C 2211/5623* (2013.01); *G11C 2211/5624* (2013.01); *G11C 2211/5625* (2013.01)

(58) Field of Classification Search
CPC ... G11C 11/5628; G11C 11/5642; G11C 5/04; G11C 2211/5623; G11C 2211/5625; G11C 2211/5624; G11C 2211/5621
USPC ..................................................... 365/185.03
See application file for complete search history.

(56) References Cited

U.S. PATENT DOCUMENTS

| | | | |
|---|---|---|---|
| 7,649,776 B2* | 1/2010 | Abiko | G11C 16/0483 365/185.12 |
| 8,358,542 B2* | 1/2013 | Radke | G11C 16/28 365/185.21 |
| 8,862,969 B2 | 10/2014 | Liikanen et al. | |
| 10,885,975 B2* | 1/2021 | Sheperek | G11C 11/5628 |
| 2008/0137416 A1 | 6/2008 | Lee | |
| 2013/0094294 A1* | 4/2013 | Kwak | G11C 16/08 365/185.03 |
| 2013/0308381 A1 | 11/2013 | Alrod et al. | |
| 2014/0281769 A1 | 9/2014 | Ohshima | |

(Continued)

*Primary Examiner* — Tha-O H Bui
(74) *Attorney, Agent, or Firm* — Lowenstein Sandler LLP

(57) ABSTRACT

A processing device performs a multi-pass programming operation on the memory device resulting in first pass programming distributions and second pass programming distributions. One or more read level thresholds between the second pass programming distributions are changed. Responsive to changing the one or more read level thresholds between the second pass programming distributions, one or more read level thresholds between the first pass programming distributions are adjusted based on the changes to the one or more read level thresholds between the second pass programming distributions.

20 Claims, 12 Drawing Sheets

(56) References Cited

U.S. PATENT DOCUMENTS

2015/0348620 A1* 12/2015 Choi .................. G11C 16/0483
                                                              365/185.03
2016/0118131 A1   4/2016 Dong et al.
2017/0076801 A1   3/2017 Shirakawa et al.

* cited by examiner

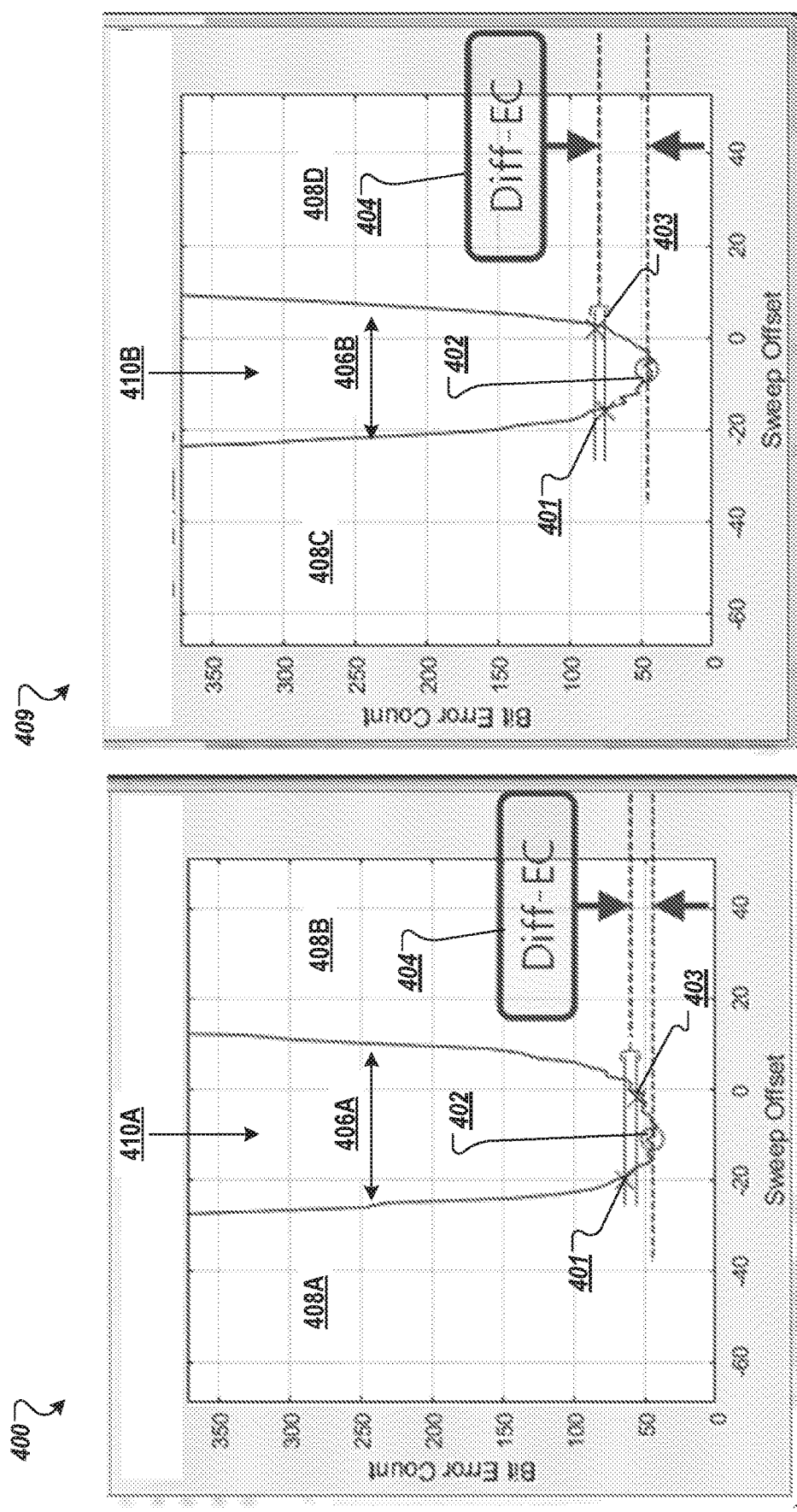

DRAGGING FIRST PASS READ LEVEL THRESHOLDS BASED ON CHANGES IN SECOND PASS READ LEVEL THRESHOLDS

RELATED APPLICATIONS

This application is a continuation application of co-pending U.S. patent application Ser. No. 16/295,829, filed Mar. 7, 2019, which is hereby incorporated by reference in its entirety herein.

TECHNICAL FIELD

Embodiments of the disclosure relate generally to memory sub-systems, and more specifically, relate to dragging first pass read level thresholds based on changes in second pass read level thresholds.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

FIGS. 4A-4B illustrate difference error counts of two read level thresholds between two adjacent program distributions, in accordance with some embodiments of the disclosure.

DETAILED DESCRIPTION

Figure 1:
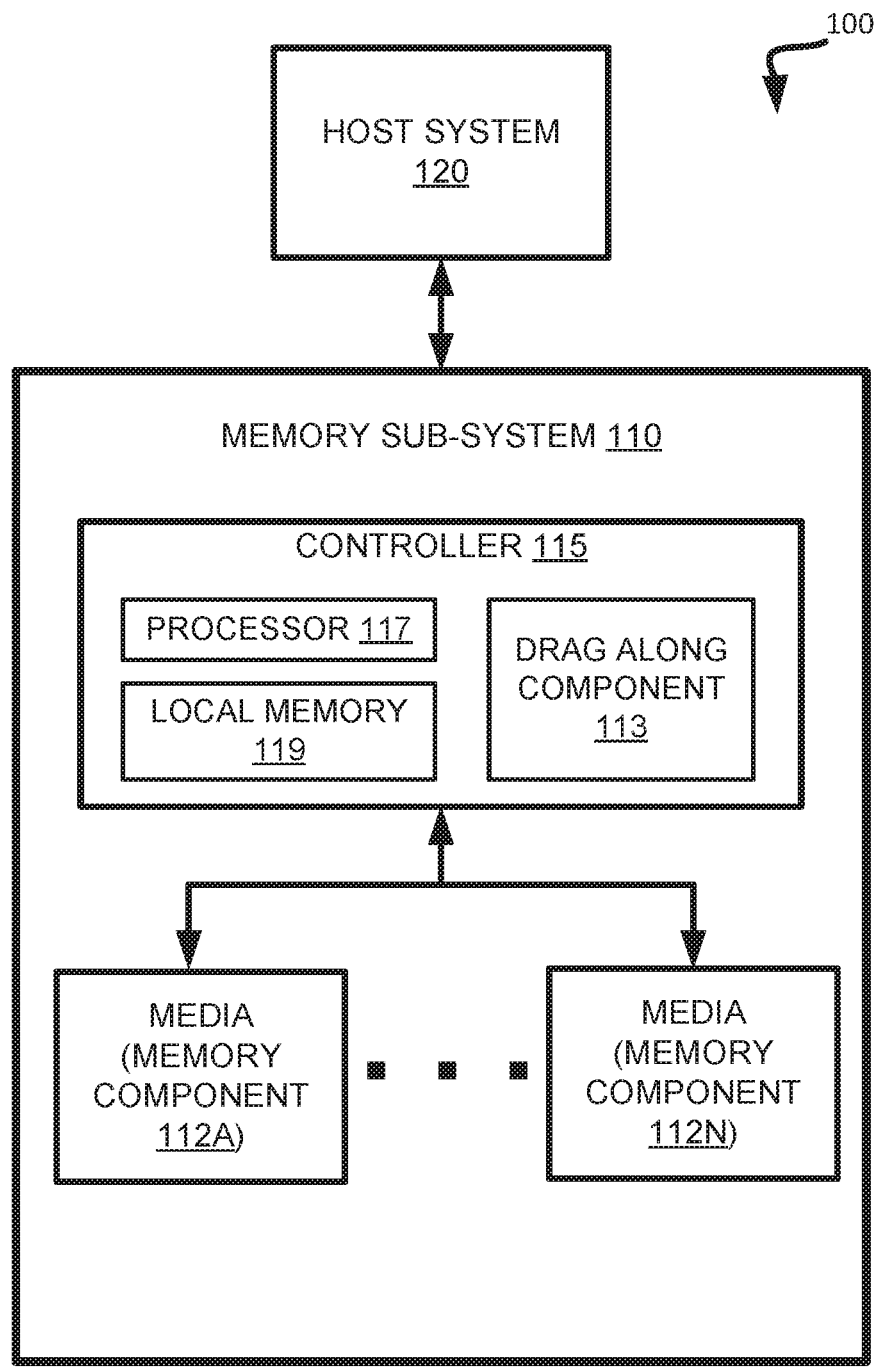
FIG. 1 illustrates an example computing environment that includes a memory sub-system, in accordance with some embodiments of the disclosure.

Aspects of the present disclosure are directed to the dragging first pass read level thresholds based on changes in second pass read level thresholds in memory cells of a memory sub-system. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. In some embodiments, the memory sub-system can be a hybrid memory/storage sub-system. In general, a host system can utilize a memory sub-system that includes one or more memory components. The host system can provide data to be stored at the memory sub-system and can request data to be retrieved from the memory sub-system.

A single-level cell (SLC) can store only one bit per memory element, whereas a multi-level cell (MLC) is a memory element that is capable of storing more than a single bit of information. It should be noted that the state of the memory cell can be programmed and the state of the memory can be determined by comparing a read voltage of the memory cell against one or more read level thresholds. That is, with SLC NAND flash technology, each cell can exist in one of two states, storing one bit of information per cell, whereas MLC NAND flash memory has four or more possible states per cell, so it can store two or more bits of information per cell. The higher number of possible states reduces the amount of margin (e.g., valley margin) separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information with sixteen voltage states. For example, in a QLC memory, a memory cell can store four bits of data (e.g., 1111, 0000, 1101, etc.) corresponding to data received from the host system using the sixteen voltage states. It can be noted that operations herein can be applied to any multi-bit memory cells.

Each bit of the memory cell is stored at a different portion (also referred to as "logical page" hereafter) of the memory cell. Various read level thresholds can be used for the various logical page types (also referred to as "page types" herein): SLC page types are lower logical pages (LPs), MLC page types are LPs and upper logical pages (UPs), TLC page types are LPs, Ups, and extra logical pages (XPs), and QLC page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

In embodiments, the memory sub-system receives a request from a host system to perform a programming operation to store data at the QLC memory (or other memory components having memory cells that store two or more bits). The memory sub-system can store the data by performing multi-pass programming (e.g., two or more programming passes) that each programs or stores data at the memory cell. A first programming pass can program data at the memory cell at a particular time. At a later time, a second programming pass can be performed on the memory cell to store additional data at the memory cell. The second programming pass uses the information stored in the first programming pass. A certain amount of time can elapse between the memory sub-system performing the first programming pass and performing the second programming pass on the same memory cell. During a first programming pass of a two-pass programming operation, the memory sub-system can apply one or more voltage levels to the memory cell to program a first set of bits (e.g., 3 bits in 3 logical pages). During a second programming pass of the two-pass programming operation, the memory sub-system can apply one or more voltage levels to the memory cell to program an additional bit to the first set of bits (e.g., 4 bits in 4 logical pages). The level that the memory cell is programmed to in the second programming pass can be based on the last logical page of the memory cell as well as the prior logical pages that were programmed at the memory cell in the first programming pass.

A continuous read level calibration (cRLC) operation continuously samples valley margins between programming distributions. The valley margin can refer to a relative width or relative margin between pairs of adjacent programming distributions. For example, valley margins associated with a particular logical page type can indicate the relative width between pairs of programming distributions associated with the particular logical page type. For instance, a first valley margin of an upper logical page (e.g., valley 2 that is between the $2^{nd}$ distribution (L1) and $3^{rd}$ distribution (L2)) that is larger than a second valley margin of the upper logical page (e.g., valley 6 that is between the $6^{th}$ distribution (L5) and the $7^{th}$ distribution (L6)) can indicate that the first valley is larger than the second valley (e.g., valley 2 is large than valley 3), but does not explicitly recite the absolute width or size of either valley. Valley margin can be correlated with read window budget (RWB). Read window budget can refer to an absolute measurement in volts (e.g., millivolts (mV)) between two adjacent programming distributions. For example, the RWB for valley 2 can be 270 mV and the RWB for valley 6 can be 250 mV. If for example, the first valley margin is larger than the second valley margin, then a correlation that the RWB of the first valley margin is larger than the RWB of the second valley margin can be made. A first-pass cRLC can be performed during or after a first pass programming operation. It can be noted that in some implementations, a first-pass cRLC is an optional operation. A second pass cRLC can be performed during or after a second pass programming operation. The cRLC operation measures and collects information about the valley margins, such as the center bit error count (CenterBEC) and the difference error count (Diff-EC) measurements. The Diff-EC is a metric derived from measurements taken at a valley between two adjacent programming distributions that is indicative of the valley's relative width or margin. For example, two valleys with the same Diff-EC have valley widths that are approximately the same. The difference error (or difference error count) can be inversely proportional to the valley margins. The CenterBEC can be a measurement taken at a valley between two adjacent programming distributions that is indicative of the lowest point in the valley.

The cRLC operation is a read level calibration that can be performed for each of the multiple read level threshold registers used during all read operations. The cRLC operation can be performed to keep each read level threshold centered so that the memory component can achieve the best overall bit error rate (BER) possible. The cRLC operation is referred to as continuous because the operation samples continually and dynamically at discrete intervals. For example, a sample, which can be a set of three reads, can be made at about 1 sample operation in every 1 to 30 seconds, depending on the requirements. Each sample initiated by the cRLC operation returns data for a particular die and a particular logical page type so that over many of these operations the information is aggregated and fed back in a closed loop system such that each die or read level threshold is kept calibrated (e.g., the read level threshold is centered). In one implementation, a sample is three reads from the same read threshold valley (e.g., also referred to as "valley" or "Vt distribution valley" herein). The read level thresholds of the memory component can start with manufacturing default read level thresholds. The cRLC operation can be run during a test mode so that all read level offset trims of all word line groups (WLGs) of all dies in the memory system are calibrated (also referred to as "converged" herein). A memory cell (or WLG or memory component, etc.) that is calibrated or converged by cRLC has a center value that corresponds to a read level threshold (or read level trim) that is centered in or at a lowest point in the read threshold valley. A memory cell (or WLG or memory component, etc.) that is calibrated or converged by cRLC has a center value that results in a lowest bit error rate (BER). BER can refer to a ratio of a number of bits in error of a data vector divided by a total number of bits for the given data vector. A trim can refer to digital value that is used for a circuit, such as a register, that is converted into an analog voltage value. For example, the read threshold trims can be programmed into a trim register, which produces a read threshold voltage used to read data from a memory cell. The cRLC measurements can also be used for various types of Dynamic Program Targeting (DPT) operations.

A DPT operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding program distribution. The program distribution can illustrate the range of threshold voltages for memory cells programmed at a particular PV target. The DPT operation is a PV targeting calibration that can be done for each PV target. The DPT operation can be considered as a set of one or more operations to adjust or calibrate the placement of PV targets. The DPT operation calibrates (also referred to as "balances" herein) multiple logical page types such that the BER of each logical page type will be approximately the same through the life of the memory system and through all operating environments (e.g., minimizes BER sigma).

For example, the DPT operation can adjust the three TLC logical page types: Lower logical page (LP), upper logical page (UP), and Extra logical page (XP) such that the BER of each of these three logical page types will be approximately the same (i.e., balanced). The DPT operation uses the cRLC as the feedback metric in a closed loop feedback system. The DPT operation, in addition to balancing logical page type BER, keeps the BER of each logical page type balanced dynamically by performing the DPT operation during block programming, such as between the first programming pass and the second programming pass of a multi-pass programming operation on a block. Balancing the BER can reduce the average trigger rate throughout the life of each die, including end-of-life (EOL) conditions.

The DPT operation can increase endurance (i.e., more total Program/Erase cycles) for each die in a memory sub-system. Using the DPT operation, no one logical page type will dominate the end of life criteria. The DPT operation can be performed independently for each word line group. The PV targets of the memory component can start with manufacturing default PV targets. The DPT operation can be run during a test mode so that all PV targets of all word line groups (WLGs) of all dies in the memory sub-system have been balanced (i.e., when the BERs of the logical page types are approximately the same). In the test mode, the cRLC and DPT operations can run at an accelerated rate for a short period of time in the factory so that each WLG will have optimized and converged the cRLC read thresholds prior to deployment. The cRLC and DPT operations can be performed in an interleaved or concurrent method so that the memory system is continually maintained at its optimum and controlled valley margin through the life of the memory component.

In operational mode (e.g., when in operation in the field), the cRLC and DPT operations can be run dynamically to extend the usable lifetime of the memory component. The term "dynamic" as used herein can refer to processes, functions, operations, or implementations that occur during operation, usage, or deployment of a corresponding device, system, or embodiment, and after or while running the manufacturer's or third-party firmware. The dynamically occurring processes, functions, operations, or implementations can occur after or subsequent to design, manufacture, and initial testing, setup or configuration (e.g., after test mode).

In some conventional memory sub-systems, the read level thresholds associated with a first programming pass (also referred to as "pass programming" or "first pass programming" herein) are adjusted independently from read level thresholds associated with a second programming pass (also referred to as "pass programming" or "second pass programming" herein). Additional operations can be performed to adjust read level thresholds associated with the first programming pass that can decrease throughput and efficacy of memory sub-systems. Additionally, read level thresholds associated with the first programming pass that are adjusted independently from read level thresholds associated with the second programming pass can have high probability of pre-read bit errors, which increases the probability of uncorrectable error correction code (UECC) errors for the memory sub-system.

Aspects of the disclosure address the above challenges by performing a "drag along" operation that "drags" first programming pass read level thresholds using measured changes in read level thresholds from the second programming pass. To maintain optimum performance, information on changes to second programming pass read level thresholds is used to apply proportional changes to first programming pass read level thresholds so that the corresponding first programming pass read level thresholds are "dragged along" with changes in the second programming pass read level thresholds.

In some embodiments, a first programming pass of a multi-pass programming operation is performed that results in first pass programming distributions. The read level thresholds associated with the first programming pass can be established using default read level trim values. A second programming pass of the multi-pass programming operation is performed that results in second pass programming distributions. A cRLC operation can be performed to calibrate the read level thresholds of the second programming pass. Over time the memory component wears and the optimum read level thresholds change. As such, subsequent to the initial cRLC calibration, another cRLC re-calibration can be performed that adjust one or more of the read level thresholds of the second programming pass. The changes to the one or more read level thresholds of the second programming pass can be used to adjust corresponding read level thresholds of the first programming pass. It can be noted that that the initial or first calibration of the read level thresholds of the second pass programming distributions can serve as a starting point, where adjustments made from the "starting point" of the read level thresholds of the second programming pass can be used to "drag along" corresponding read level thresholds of the first pass programming distributions.

In embodiments, the one or more of the first read level thresholds of first pass programming are adjusted proportionally to the change in the one or more second read level thresholds of the second pass programming. In embodiments, particular second read level thresholds of the second programming pass can correspond to particular first read level thresholds of the first programming pass. For example, in FIG. 5, read level threshold 515 of first pass programming can correspond to read level thresholds 529 and 531 of the second pass programming, so that changes to read level thresholds 529 and 531 of the second pass programming influence the "drag along" changes to read level threshold 515 of first pass programming. Similarly, changes to read level thresholds 529 and 531 of the second pass programming do not influence or "drag along" changes to read level thresholds of first pass programming (e.g., read level threshold 513) that do not correspond to read level thresholds 529 and 531 of the second pass programming. In another example, if read level threshold 529 of the second pass programming is adjusted a positive 20 millivolts (mV), read level threshold 515 of first pass programming can be adjusted a proportional amount (e.g., 20 mV) in a "drag along" operation.

In some embodiments, to adjust the first read level thresholds between the first pass programming distributions based on the second read level thresholds of second pass programming, the memory sub-system determines whether the change in the one or more second read level thresholds of second pass programming satisfies a rule. The one or more of the first read level thresholds of first pass programming are adjusted responsive to determining that the change in the corresponding one or more second read level thresholds of second pass programming satisfies the rule. An exemplary rule can be that if the read level threshold 529 (see FIG. 5) of the second pass programming is adjusted a threshold amount (e.g., magnitude), then corresponding read level threshold 515 of first pass programming can be adjusted a proportional amount in a "drag along" operation. It can be noted that different rules can implemented depending on the application, design specification, and so forth.

Advantages of the disclosure include, but are not limited to, dragging first pass read level thresholds based on changes in second pass read level thresholds to reduce the probability of memory component pre-read bit errors (during second pass programming) and to reduce the probability of uncorrectable error correction code fatal memory sub-system error.

FIG. 1 illustrates an example computing environment 100 that includes a memory sub-system 110, in accordance with some embodiments of the disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups (e.g., multiple wordlines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a drag along component 113 that performs operations as described herein. In some embodiments, the drag along component 113 can be part of host system 120, controller 115, memory component 112N, an operating system, or an application. Drag along component 113 can adjust ("drag along") read threshold levels associated with first pass programming based on changes made to read threshold levels associated with second pass programming. For example, the controller 115 can include a processor 117 (processing device) configured to execute instructions stored in local memory 119 for performing the operations described herein.

Figure 2:
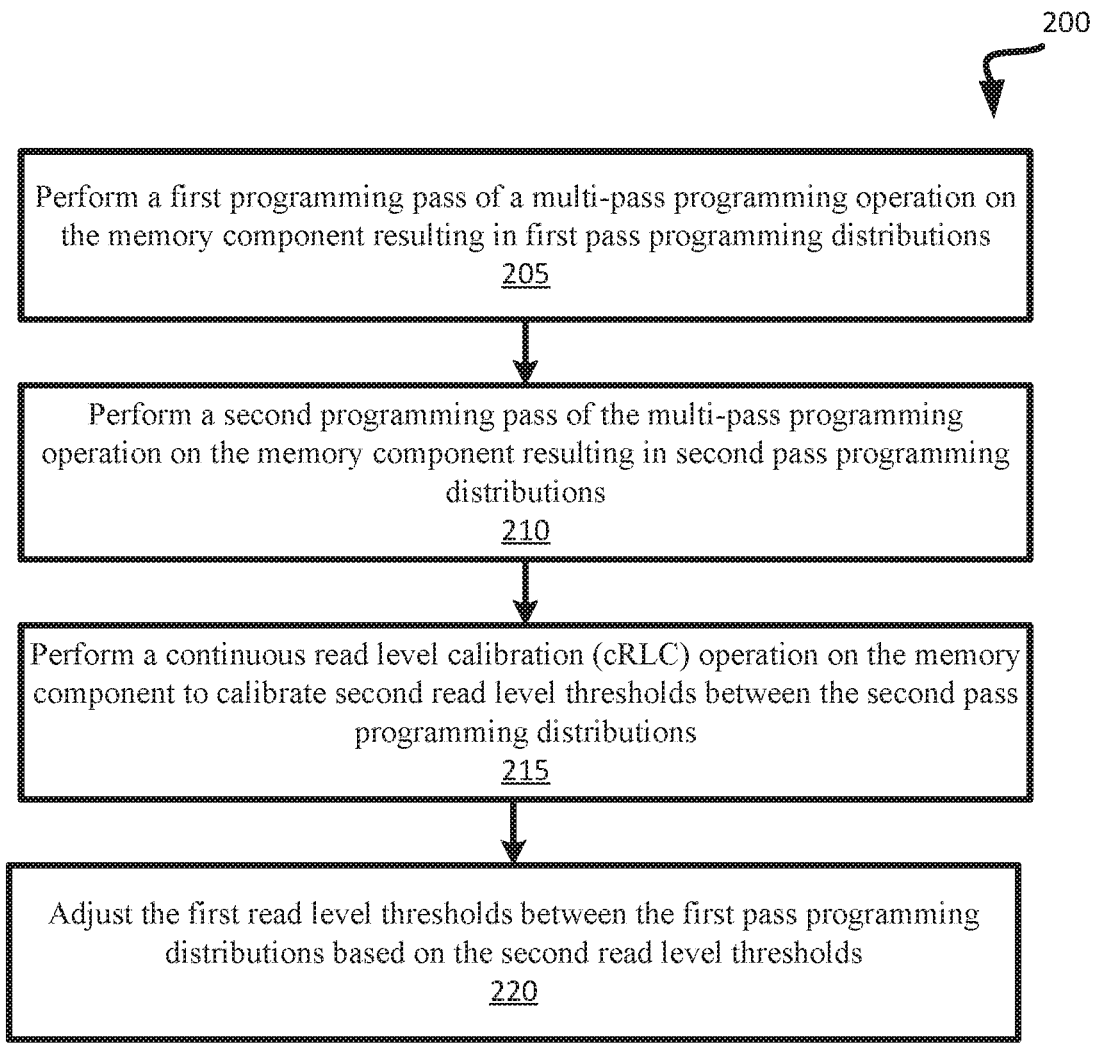
FIG. 2 is a flow diagram of an example method to adjust read level thresholds between first pass programming distributions based on changes to read level thresholds between second pass programming distributions, in accordance with some embodiments of the disclosure.

FIG. 2 is a flow diagram of an example method 200 to adjust read level thresholds between first pass programming distributions based on changes to read level thresholds between second pass programming distributions, in accordance with some embodiments of the disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 200 is performed by the drag along component 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used.

At operation 205, processing logic performs a first programming pass of a multi-pass programming operation on the memory component resulting in first pass programming distributions. The first read level thresholds are established between the first pass programming distributions. First programming passes and first pass programming distributions are further described below at least with respect to FIGS. 5, 6, 7, and 8.

In some embodiments, the processing logic programs the memory component with default read level thresholds to establish the first read level thresholds between the first pass programming distributions. In other embodiments, the first read level thresholds can be established using a cRLC operation that is further described below at least with respect to FIGS. 4A-4B.

In some embodiments, a cRLC operation (also referred to as "first pass cRLC" herein) on the memory component to calibrate the first read level thresholds is not performed between the performance of the first programming pass and the second programming pass of the multi-pass programming operation. By not performing a first pass cRLC and using a cRLC "drag along" operation to adjust the first read level thresholds between the first pass programming distributions can make the memory sub-system more performant, as performing the first pass cRLC can be inefficient in some cases.

At operation 210, processing logic performs a second programming pass of the multi-pass programming operation on the memory component resulting in second pass programming distributions. Second programming passes and second pass programming distributions are further described at least with respect to FIGS. 4C, 5, and 7. In embodiments, the number of first pass programming distributions is less than or equal to a number of second pass programming distributions.

At operation 215, processing logic performs a continuous read level calibration (cRLC) operation on the memory component to calibrate second read level thresholds between the second pass programming distributions.

In embodiments, to perform the cRLC operation on the memory component to calibrate the second read level thresholds between the second pass programming distributions, processing logic adjusts one or more of the second read level thresholds to a center value that results in a lowest bit error rate.

In some embodiments, subsequent to performing the cRLC operation to calibrate (e.g., first calibration) the second read level thresholds between the second pass programming distributions, processing logic changes one or more of the second read level thresholds between the second pass programming distributions. For example, after calibrating the read level thresholds between the second pass programming distribution an event can occur that causes processing logic to adjust the PV targets of the second pass programming distributions via a DPT operation. Such changes to the PV targets of the second pass programming distributions can be "dragged along" to the first pass programming distributions so that changes to the second pass programming distributions cause resultant changes to the first pass programming distributions (sometimes without performing first pass DPT). Since the PV targets associated with the second pass programming distributions are changed, one or more corresponding read threshold hold levels (e.g., corresponding to the moved second pass programming distributions) can also be adjusted accordingly. For instance, another cRLC operation can be used to re-calibrate (e.g., second calibration) the corresponding read threshold levels between the second pass programming distributions. The first read threshold levels can be "dragged along" or changed based on the re-calibration of the read level thresholds of the second pass programming distributions. It can be noted that that the initial or first calibration of the read level thresholds of the second pass programming distributions can serve as a "starting point," where adjustments made from the "starting point" of the read level thresholds of the second pass programming distributions can be used to "drag along" the corresponding read level thresholds of the first pass programming distributions.

At operation 220, subsequent to performing the cRLC operation on the memory component to calibrate the second read level thresholds, processing logic adjusts the first read level thresholds between the first pass programming distributions based on the second read level thresholds. In some embodiments, to adjust the first read level thresholds between the first pass programming distributions based on the second read level thresholds, processing logic determines the change in the one or more second read level thresholds and adjusts one or more of the first read level thresholds based on the determined change in the one or more second read level thresholds. As noted above, in some embodiments the change in the one or more second read level thresholds of the second pass programming distributions occurs after an initial calibration of the second real level thresholds where one or more of the second read level thresholds moves or changes from a "starting point" established by the initial cRLC calibration of the second read level thresholds. In embodiments, the one or more of the first read level thresholds are adjusted proportionally to the change in the one or more second read level thresholds.

In embodiments, particular second read level thresholds of the second programming pass can correspond to particular first read level thresholds of the first programming pass. For example, in FIG. 5, read level threshold 515 of first pass programming can correspond to read level thresholds 529 and 531 of the second pass programming, so that changes to read level thresholds 529 and 531 of the second pass programming influence the "drag along" changes to read level threshold 515 of first pass programming. Similarly, changes to read level thresholds 529 and 531 of the second pass programming do not influence "drag along" changes to read level thresholds of first pass programming (e.g., read level threshold 513) that do not correspond to read level thresholds 529 and 531 of the second pass programming. For instance, if read level threshold 529 of the second pass programming is adjusted a positive 20 millivolts (mV), read level threshold 515 of first pass programming can be adjusted a proportional amount (e.g., 20 mV) in a "drag along" operation. But read level threshold 513 of the first pass programming does not correspond to read level threshold 529 of the second pass programming, and is not affected or adjusted based on the change in read level threshold 529 of the second pass programming. Correspondence of first read level thresholds of first pass programming to particular second read level thresholds of second pass programming is further described at least with respect to FIGS. 5 and 7.

In some embodiments, to adjust the first read level thresholds between the first pass programming distributions based on the second read level thresholds, processing logic determines whether the change in the one or more second read level thresholds satisfies a rule. One or more of the first read level thresholds are adjusted responsive to determining that the change in the one or more second read level thresholds satisfies the rule. For example, an exemplary rule can be that if read level threshold 529 of the second pass programming is adjusted a threshold amount (e.g., magnitude), then read level threshold 515 of first pass programming is to be adjusted a proportional amount in a "drag along" operation. It can be noted that different rules can implemented depending on the application, design specification, and so forth. Rules are further described at least with respect to FIG. 5.

In another embodiment, the memory component includes a block with multiple memory cells organized in wordlines and wordline groups. The memory cell can be a sample cell of a first wordline group of the multiple wordline groups. The block can further include a second sample memory cell in a second wordline group of the multiple wordline groups. In embodiments, the read level thresholds of first pass programming of a wordline group of multiple wordline groups of a block are adjusted based on changes made to (calibrated) read level thresholds of second pass programming (e.g., "drag along" operation) of other wordline groups of the multiple wordline groups of the block. In some embodiments, the read level thresholds of first pass programming of a wordline of multiple wordlines of a block are adjusted based on changes made to (calibrated) read level thresholds of second pass programming (e.g., "drag along" operation) of other wordlines of the multiple wordlines of the block.

In one embodiment, the memory cell, after the first programming pass, includes the $1^{st}$ Vt distribution, the $2^{nd}$ Vt distribution, a third first-pass programming distribution ($3^{rd}$ Vt distribution), and a fourth first-pass programming distribution ($4^{th}$ Vt distribution). The read level threshold is between the $1^{st}$ Vt distribution and the $2^{nd}$ Vt distribution as described above. Also, a second read level threshold is between the $2^{nd}$ Vt distribution and the $3^{rd}$ Vt distribution, and a third read level threshold is between the $3^{rd}$ Vt distribution and the $4^{th}$ Vt distribution. The memory cell, after the second programming pass, includes eight Vt distributions, eight PV targets, and seven read level thresholds, each between two of the eight Vt distributions. In embodiments, read level thresholds of first pass programming can be adjusted based on changes made to (calibrated) read level thresholds of the second pass programming (e.g., "drag along" operation). Additional details of the multi-pass programming sequences are described and illustrated with respect to FIGS. 5-8.

Operations described herein can be performed on a data block (e.g., a group of memory cells), a word line group, a word line, or individual memory cells. For example, the operations described with respect to a memory cell in the disclosure can also be used with a data block that is a group of memory cells.

Figure 3:
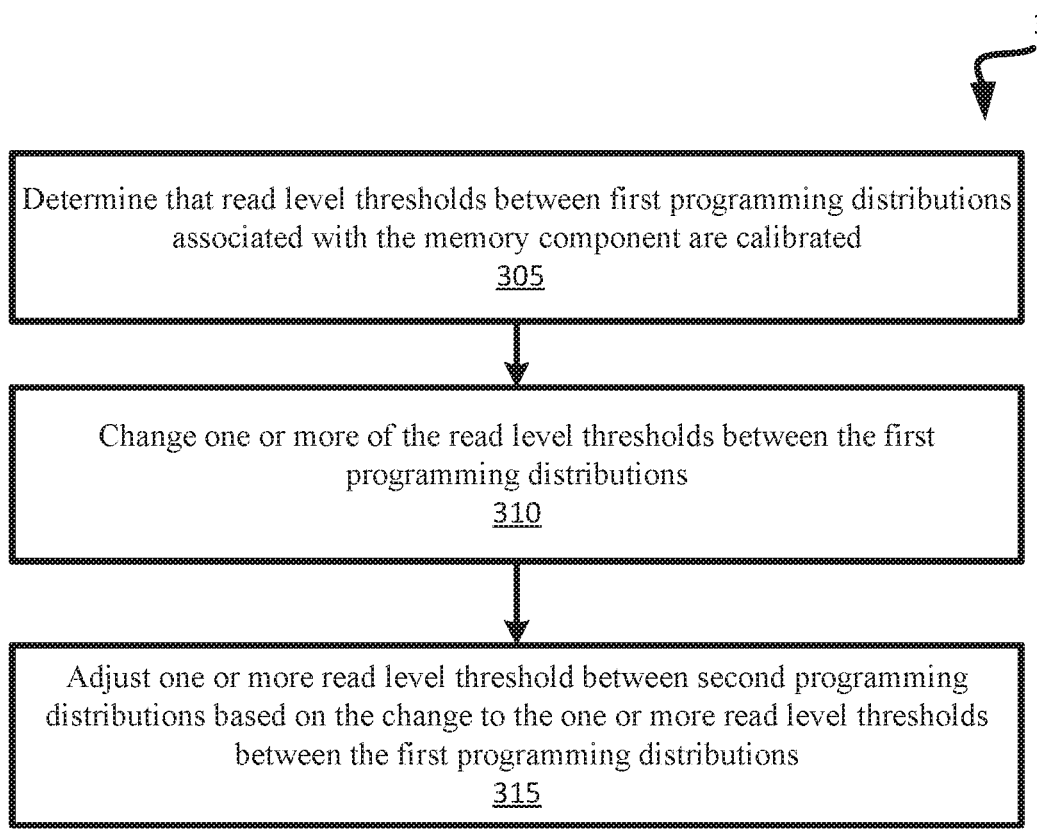
FIG. 3 is a flow diagram of an example method to adjust one or more read level threshold between programming distributions of first pass programing based on the change to the one or more read level thresholds between the programming distributions of second pass programming, in accordance with some embodiments of the disclosure.

FIG. 3 is a flow diagram of an example method 300 to adjust one or more read level threshold between programming distributions of first pass programing based on the change to the one or more read level thresholds between the programming distributions of second pass programming, in accordance with some embodiments of the disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the drag along component 113 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all processes are required in every embodiment. Other operations flows are possible. In some embodiments, different operations can be used.

At operation 305, processing logic determines that read level thresholds between first programming distributions (of a second programming pass) associated with the memory component are calibrated. In embodiments, to determine that the read level thresholds between the first programming distributions (of second programming pass) associated with the memory component are calibrated, processing logic determines that the read level thresholds between the first programming distributions (of second programming pass) have been adjusted to a center value that results in a lowest bit error rate.

At operation 310, processing logic changes one or more of the read level thresholds between the first programming distributions (of the second programming pass). Changes to one or more of the read level thresholds between the first programming distributions (of the second programming pass) is further described at least with respect to FIG. 2.

At operation 315, processing logic performs a "drag along" operation by adjusting one or more read level threshold between second programming distributions (of the first programming pass) based on the change to the one or more read level thresholds between the first programming distributions (of the second programming pass). In embodiments, a number of the second programming distributions (of the first programming pass) is less than or equal to the number of the first programming distributions (of the second programming pass).

In embodiments, processing logic adjusts the one or more of read level thresholds between the second programming distributions (of the first programming pass) proportionally to the change in the one or more read level thresholds between the first programming distributions (of the second programming pass). Similar as to described above and with respect to FIG. 5, particular read level thresholds of the first programming pass correspond to particular read level thresholds between the first programming distributions (of the second programming pass), so that changes to the particular read level thresholds between the first programming distributions (of the second programming pass) can affect or influence proportional changes to corresponding read level thresholds between the second programming distributions (of the first programming pass).

In embodiments, to adjust the one or more read level thresholds between the second programming distributions (of the first programming pass) based on the change to the one or more read level thresholds between the first programming distributions (of the second programming pass), processing logic determines whether the change in the one or more read level thresholds between the first programming distributions (of the second programming pass) satisfies a rule. One or more of the read level thresholds between the second programming distributions (of the first programming pass) are adjusted responsive to determining that the change in the one or more read level thresholds between the first programming distributions satisfies the rule. Rule-based changes are further described with respect to FIGS. 2 and 5.

FIGS. 4A-4B illustrate difference error counts of two read level thresholds between two adjacent program distributions, in accordance with some embodiments of the disclosure. Graph 400 shows a valley 410A between a pair of adjacent programming distributions 408A and 408B. Valley 410A-B can refer to the area between two adjacent distributions. Valley margin 406A is also shown between programming distributions 408A and 408B. Graph 409 shows a valley 410B between a pair of adjacent programming distributions 408C and 408D. Valley margin 406B is also shown between programming distributions 408C and 408D.

Valley margin 406A-B can refer to a relative width or relative margin between pairs of adjacent programming distributions. One or more of programming distributions 408A-408D are generally referred to as "programming distribution(s) 408" herein. One or more of margin valleys 406A-406B are generally referred to as "margin valley(s) 406" herein. One or more of valleys 410A-410B are generally referred to as "valley(s) 410" herein.

The cRLC operation samples each logical page type in each WLG. Each sample can include 3 reads: low-sample 401 (also referred to as "negative offset value" herein), center-sample 402 (also referred to as "center value" herein), and high-sample 403 (also referred to as "positive offset value" herein). As noted above, the cRLC operation calibrates or converges by obtaining a center value that results in a lowest bit error rate (BER). Convergence is when a read level trim has the value that returns the fewest number of page or code word errors. This is what is called the calibrated or centered value and results in the best BER. In addition to finding the center of the valley 410, the cRLC operation calibrates or converges by balancing the side samples (low-Sample 401 and High-Sample 403) so that that the low-sample 401 and the high-sample 403 are equal in magnitude for a particular valley and the other valleys associated with a particular logical page type. In some embodiments, the low-sample 401 and the high-sample 403 are equal in magnitude for all the valleys for all the logical page types (or for multiple logical page types). In some embodiments, the low-sample 401 and the high-sample 403 are equal in magnitude for at least some valleys of a particular logical page type. Graph 400 and graph 409 show examples of calibrated valleys with the center samples 402 being balanced between the side samples (e.g., the 4 side samples in both graph 400 and 409 are roughly equal in magnitude). Graph 409 demonstrates wide valley behavior and graph 409 demonstrates narrow valley behavior. During cRLC sampling and updating, when the read level trims (e.g., trim registers) are centered, the value of the trim will start "dithering." Anytime a cRLC read level trim changes direction (increasing the trim value, then decreasing the trim value, and vice versa) is considered a dither. This action of dithering indicates the trim is centered. When dithering occurs for a trim, the center value will be set.

The center-samples 402 are used as feedback metrics by DPT to equalize the LP/UP/XP error rates by moving PV targets slightly. But, center-samples 402 are be enough to equalize the BER between the logical page types (LP/UP/XP). For each logical page type, the valley margin can also have a reasonable match. The default PV targets can determine the depths of the valleys 410 between the program distributions 408, the depths being related to valley margin 406 of each valley 410. To determine the valley margin 406 of a program distribution 408, the cRLC operation can determine values of a metric that is indicative of the width (or depth) between adjacent pairs of programming distributions 408. In some embodiments, the metric is a difference error and values of the metric are difference error counts (Diff-EC) (also referred to as "Diff-EC measurement(s)" herein). The difference error can be inversely proportional to the valley margins. For example, as illustrated the Diff-EC of graph 400 is smaller than the Diff-EC of graph 409, and valley margin 406A of graph 400 is larger than valley margin 406B of graph 409. The cRLC operation can determine the Diff-EC measurements 404. The Diff-EC measurements 404 can be used to identify relative valley margins. The Diff-EC measurements 404 can be the mean of the two side samples 401, 403 minus the center value 402. The DPT operation can perform BER leveling by moving PV targets to match not only the error counts between logical page types, but also match the valley margins within each logical page type (or within all the logical page types). It can also be noted that valley margin can be correlated to valley depth (e.g., from peak to trough between program distributions). For example, a deep valley can correlate to a more narrow valley margin as compared to a shallow valley (e.g., less deep valley) that correlates to a wider valley margin.

It can be noted that the ECs of the center-samples 402 match when multiple valleys associated with logical pages are being measured (UP & XP). It can also be noted that the center-sample bit EC can be the error count of the center-sample 402 (e.g., vertical axis of graph 400 and 409). Despite the center-sample ECs matchings, the valley margin (or depth) can be dramatically different even within the valley of different logical page types (UP & XP). To determine which valley has the largest valley margin or the smallest valley margin, the measure of Diff-EC can be reliably used. The higher the Diff-EC measurement 404, the narrower the valley margin (or the RWB is smaller). The offsets between the Low-Sample 401, Center-Sample 402, and High-Sample 403 for different Diff-EC measurements 404 are equal for purposes of comparison. In some embodiments, the cRLC operation can keep multiple samples (e.g., 16 samples) of each cRLC trim of each die. Once all the cRLC trim is centered, the center samples 402 and Diff-EC measurements 404 can be stored for a subsequent execution of a DPT operation. As illustrated, the example of FIG. 4A has a lower Diff-EC measurement 404 than the example of FIG. 4B, which means the program distributions have a larger valley margin and is less-needy. The terms More-Needy and Less-Needy refer to the relative valley margin of valleys which apply to the same logical page type within a WLG. In other words, the Most-Needy valley for a logical page type will be the one that is dominating the Error Count or causing more BER loss than any other valley. The Diff-EC measurements can be used to determine More-Needy vs. Less-Needy valleys, including the order of Needy-Ness (most to least needy). When a TLC page stack page BER is balanced, the LP (L3/L4) will have the lowest RWB, the UP (L1/L2 and L5/L6) will be a bit higher and should be about equal, and XP (L2/L3, L4/L5, and L6/L7, notice that L0/L1 is ignored because it is special) will be the highest RWB. Accordingly, the valleys of LP will have the lowest valley margins, the valleys of UP will have a bit higher valley margin, and the valleys of XP will have the highest valley margin. It should be noted that a balanced BER causes the RWB to gravitate to the definition described above, which occurs as a natural byproduct of the DPT operation, described in more detail below.

Figure 4C:
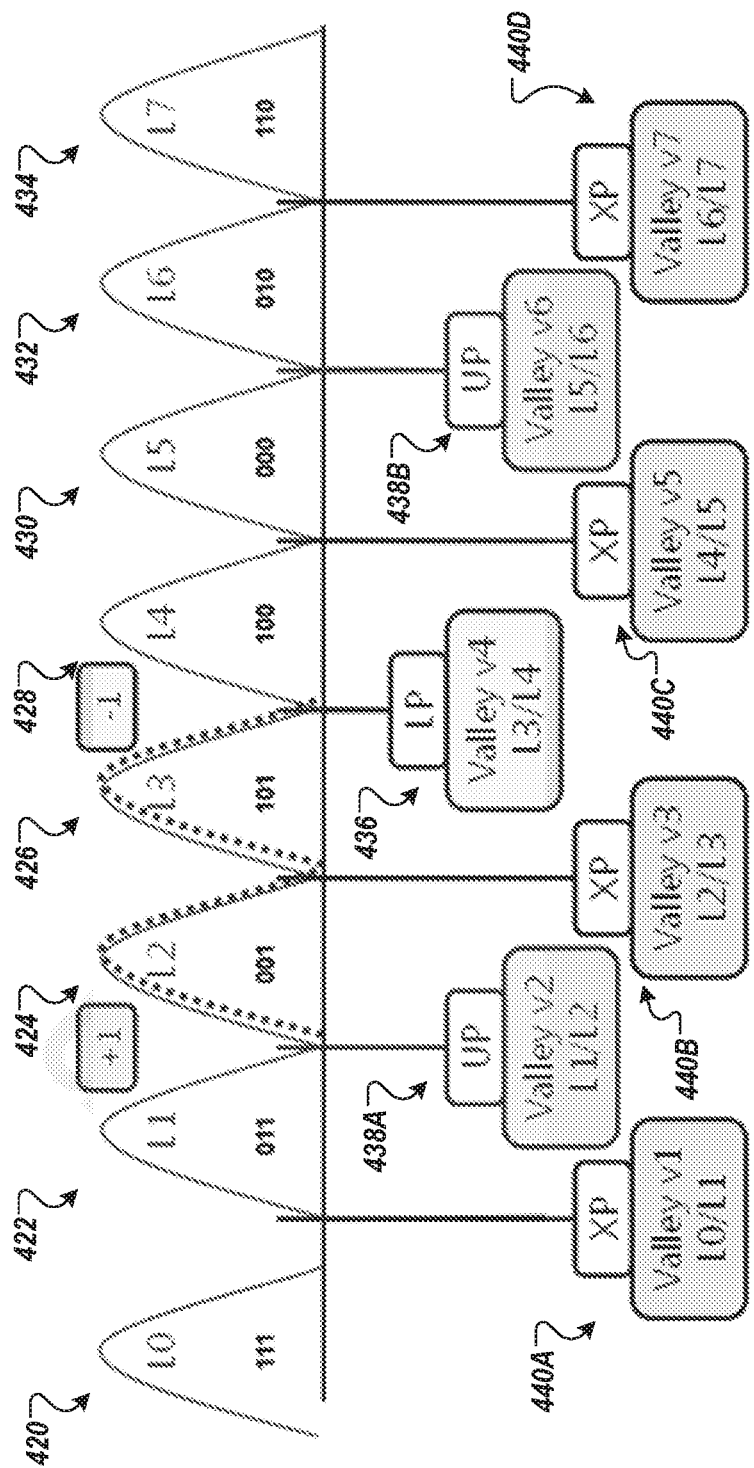
FIG. 4C illustrates eight programming distributions, including two programming distributions after at least two of PV targets are adjusted according to a DPT operation, in accordance with some embodiments of the disclosure.

FIG. 4C illustrates eight programming distributions, including two programming distributions after at least two of PV targets are adjusted according to a DPT operation, in accordance with some embodiments of the disclosure. As illustrated in FIG. 4C, most of the data in each block is stored as TLC information, including 3 bits per cell. This is accomplished using eight programming distributions 420-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The eight programming distributions 420-434 each correspond to a level (L0:L7), each level corresponding to a code (000b:111b). Between each pair of eight programming distributions 420-434 is a valley, totaling seven valleys (v1:v7). A center or peak of each programming distribution 420-434 corresponds to a PV target for the respective programming distribution 420-432. In total, there can be eight PV targets for a 3-bit representation. In some embodiments, the first programming distribution 420, corresponding to the first level L0, has a fixed PV target. In some embodiments, the eighth programming distribution 434, corresponding to the eighth level L7, can have a fixed PV target. Using DPT operations, the PV targets of the intervening programming distributions, corresponding to levels L1-L6, can be adjusted. In some embodiments, all or some of the PV targets corresponding to programming distributions 420-432 can be adjusted or fixed.

In the depicted embodiment, the DPT operation starts with each PV target in a default state as defined by factory settings. In some cases, all PV targets are adjusted, but in other embodiments, the first PV target and the last PV target can be fixed, allowing the intervening PV targets to be adjusted. For example, with eight PV targets (of L0-L7), the L0 and L7 PV targets are fixed and the other PV targets L1 through L6 can receive characterized starting values, leading to faster cRLC and DPT operation conversion. Alternatively, the L0, L1, and L7 PV targets are fixed and the other PV targets L2-L6 can be adjusted. These factory settings of the PV targets and read thresholds can produce undesirable BER results before cRLC and DPT operations.

The DPT operation can be defined as a net-zero PV target adjustment mechanism. Net-zero adjustments maintain a constant RWB for a memory cell. The total RWB for a memory cell of a multi-bit memory cell is constant, but the RWB between programming distributions can be adjusted by changing PV targets. Net-zero adjustments manages PV target adjustments for optimum BER and logical page type BER matching. This is another way of stating that, the L0 and L7 PV targets are fixed and adjustments to PV targets between L0 and L7 (L1:L6) are managed such that logical page type BER is continuously matched. The DPT operation performs PV target adjustments in order to balance logical page type BER for improved BER sigma continuously throughout the life of a memory component or memory system. The DPT operation, as described herein, can be performed between programming passes of a multi-pass programing operation, such as after a first programming pass or a second programming pass. The cRLC calibration is performed in order to perform a subsequent DPT operation. The cRLC measures and collects valley and difference error count information on the page stack and passes the information to a subsequent DPT operation. Both cRLC and DPT can be performed while a block is being programmed rather than after a block is fully programmed.

In embodiments, during programming of the selected block used for DPT, the programming sequence is interrupted to perform cRLC. Programming interruption occurs at each logical page stack (selected as one of the cRLC logical page stacks). A logical page stack can refer to all the logical page types for a particular multi-bit memory cell. The program interruption occurs just before the second-pass programming when the first-pass distributions have fully aggressed floating gate coupling from their neighbors. During block programming each of the cRLC page stacks in each of the wordline groups is interrupted and a cRLC is performed until all read level thresholds of the page stack are centered. The cRLC information from each valley, Center Bit Error Count (CenterBEC) and Difference Error Count (Diff-EC), is passed to the DPT operation for determining Program Verify (PV) Target adjustments according to the DPT rules. PV target adjustments are applied to the next block that is programmed and this process of interrupting and cRLC/DPT continues as DPT converges and finally dithers and then tracks NAND behavior. As noted above, by adjusting PV targets, DPT effectively moves the program distributions in the direction of the adjusted PV targets. DPT balancing or calibration (e.g., adjusting the PV targets) can result in valley margins of a particular logical page type to converge at a particular convergence value (e.g., same or similar Diff-EC) so that the valley margins for a particular logical page type are roughly the same. DPT calibration or convergence can include balancing the BER of each logical page type so that each valley associated with a particular logical page has roughly similar BER. During DPT PV target adjustment, when that value of the PV trim starts "dithering" (anytime a PV trim changes direction (increasing the trim value, then decreasing the trim value, and vice versa) is considered a dither), the DPT operation for the respective program distribution has converged.

In one embodiment, there are only 5 of the 8 TLC distributions adjusted in the DPT operation. The program targets for L2, L3, L4, L5, and L6 move while the program targets for L0, L1, and L7 remain fixed. As shown in FIG. 4C, the PV targets for L2 and L3 are adjusted. The program target offsets are tracked over a number of updates. A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by equalizing the BER of the LP page to other logical pages. All PV targets can stabilized after a number of P/E cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing BER equalization at time zero.

As described herein, BER equalization can be performed as a net-zero adjustment. As illustrated in FIG. 4C, one click (e.g., 10 mv) is given to one level (e.g., labeled as +1) and one click (10 mv) is taken from another level (e.g., labeled as −1). DPT operations can adjust both UP and XP relative to LP, resulting in equalization of all three TLC page types. When the DPT is a net-zero operation with feedback, the DPT is incapable of runaway behavior. It should be noted that it is possible to give more RWB to higher distributions if required for undesirable NAND behavior like retention for example.

Figure 5:
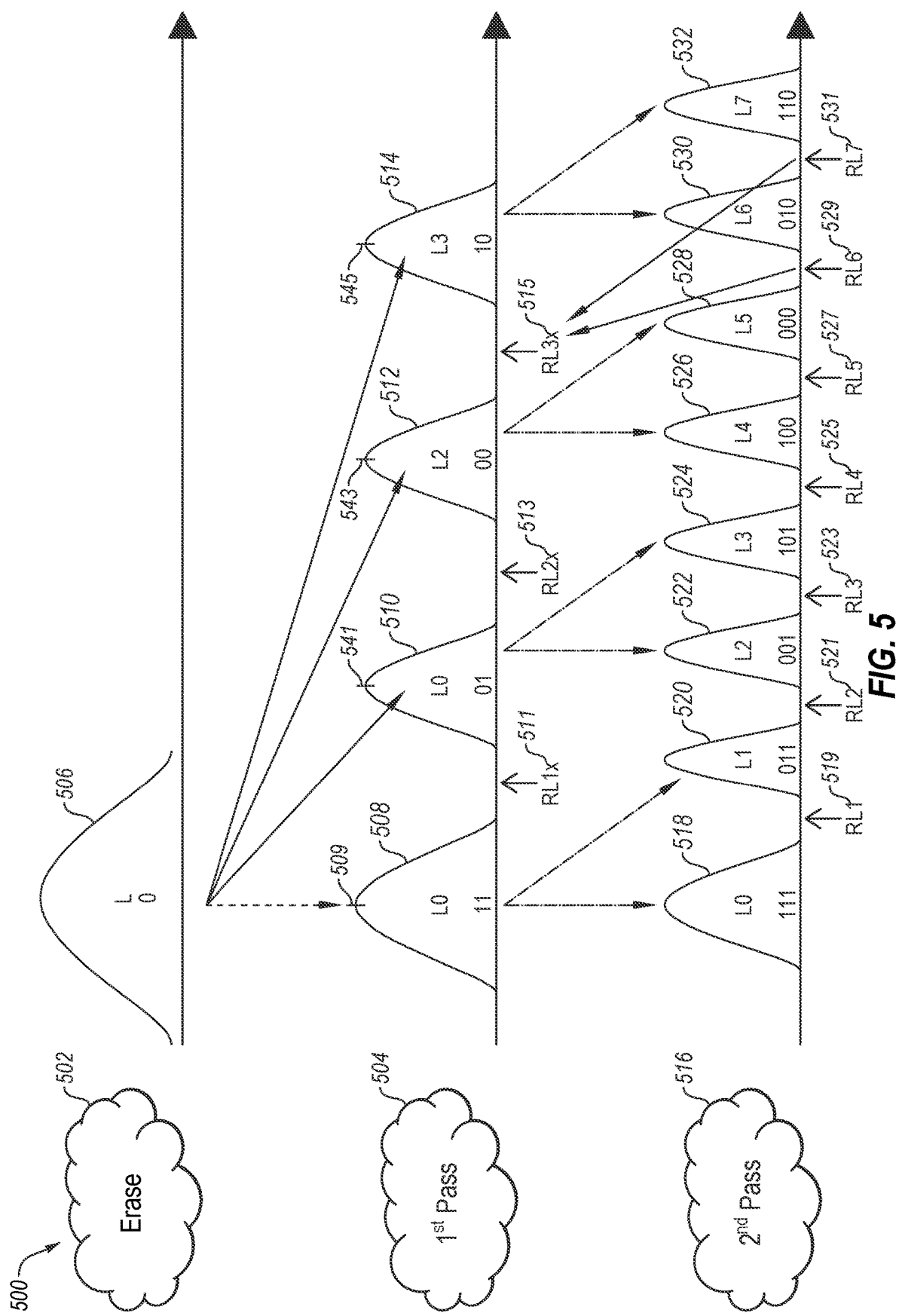
FIG. 5 illustrates a two-pass programming operation with four-to-eight programming distributions and corresponding read level thresholds, in accordance with some embodiments of the disclosure.

FIG. 5 illustrates a two-pass programming operation 500 with four-to-eight programming distributions and corresponding read level thresholds, in accordance with some embodiments of the disclosure. Before a first programming pass 504, a memory cell is in an erased state 502 and has a single Vt distribution 506 (also referred to as an "erase distribution" herein). After the first programming pass 504, the memory cell has four Vt distributions 508, 510, 512, 514 (also referred to as "programming distributions" or "first-pass programming distributions" herein) and three read level thresholds 511, 513, and 515.

In some embodiments, before a second programming pass 516, the cRLC operation can be performed to calibrate one or more of the read level thresholds 511, 513, and 515. The read level thresholds 511, 513, and 515 can be adjusted to maintain minimum BER settings throughout the life of the memory cell and track variations in valley positions due to program/erase cycles, temperature, retention, or other factors. The read level thresholds 511, 513, and 515 can have corresponding trim values for the first programming pass 504 and these values can be adjusted to achieve a specified BER setting for the respective trim. Separate trims can exist for the read level thresholds of the cell after the first programming pass 504 and for the read level thresholds of the cell after the second programming pass 516. After the cRLC operation is performed to calibrate one or more of the read level thresholds 511, 513, and 515, the DPT operation is performed to calibrate two or more PV targets 509, 541, 543, and 545. In some embodiments, the first and last PV targets 509 and 545 can be fixed, and the PV targets 541 and 543 are adjusted. It should be noted that PV targets 509, 541, 543, and 545 are illustrated as the centers of the respective programming distributions to represent the PV targets used that result in the respective programming distributions. For example, by adjusting the PV targets to the right by a certain amount results in the programming distribution being centered at the point that is to the right by the certain amount. The programming distribution effectively shifts to the right by the certain amount. After the first cRLC operation and the first DPT operation are performed, the second programming pass 516 can be performed. After the second programming pass, the memory cell has eight Vt distributions 518, 520, 522, 524, 526, 528, 530, and 532 (also referred to as second-pass programming distributions) and seven read level thresholds 519, 521, 523, 525, 527, 529, and 531. The second programming pass 516 uses the data stored at the memory cell that was programmed during the first programming pass 504, as illustrated in FIG. 5. In another embodiment, another cRLC operation can be performed to calibrate one or more of the eight read level thresholds after the second programming pass 516, such as before a third programming pass. That is, the cRLC operation can be performed before one or more subsequent programming pass operation in a multi-pass programming sequence. It can be noted that the first cRLC operation is optional in some embodiments.

In some embodiments, a first programming pass 504 of a multi-pass programming operation is performed on the memory component resulting in first pass programming distributions 508, 510, 512, and 514. A cRLC operation is not performed after the first programming pass 504 and before the second programming pass 516 of a multi-pass programming operation. Rather, before the second programming pass 516 the read level thresholds 511, 513, and 515 can be programmed to default trim values. Subsequent to programming the read level thresholds 511, 513, and 515 to default trim values, the second programming pass 516 can be performed. After the second programming pass 516, the cRLC operation can be performed to calibrate one or more of the read level thresholds 519, 521, 523, 525, 527, 529, and 531. The read level thresholds 519, 521, 523, 525, 527, 529, and 531 can have corresponding trim values and the trim values can be adjusted to achieve a specified BER setting. In some embodiments, performing the cRLC operation on the memory component to calibrate the read level thresholds 519, 521, 523, 525, 527, 529, and 531 between the second pass programming distributions 518, 520, 522, 524, 526, 528, 530, and 532 can include adjusting one or more of the read level thresholds 519, 521, 523, 525, 527, 529, and 531 to a center value that results in a lowest bit error rate (e.g., converged).

In some embodiments, after the read level thresholds 519, 521, 523, 525, 527, 529, and 531 of the second pass programming 516 have been calibrated or converged, further adjustments to the read level thresholds 519, 521, 523, 525, 527, 529, and 531 can be made. For example, one or more PV targets associated with programming distributions 518, 520, 522, 524, 526, 528, 530, and 532 can be adjusted during operation, which causes respective one or more of the read level thresholds 519, 521, 523, 525, 527, 529, and 531 to be changed. The changes to one or more of the read level thresholds 519, 521, 523, 525, 527, 529, and 531 can be used to adjust one or more corresponding read level thresholds 511, 513, and 515 (e.g., adjust the default trim values) between the first pass programming distributions 508, 510, 512, and 514. Such action can be considered a cRLC "drag along" where adjustments to the read level thresholds 519, 521, 523, 525, 527, 529, and 531 between the second pass programming distributions 518, 520, 522, 524, 526, 528, 530, and 532 are used to adjust or make decisions about adjustment of the read level thresholds 511, 513, and 515 between the first pass programming distributions 508, 510, 512, and 514.

In an embodiment, some of the read level thresholds 519, 521, 523, 525, 527, 529, and 531 between the second pass programming distributions 518, 520, 522, 524, 526, 528, 530, and 532 can correspond to respective ones of the read level thresholds 511, 513, and 515 between the first pass programming distributions 508, 510, 512, and 514 so that adjustments made to the particular read level thresholds 519, 521, 523, 525, 527, 529, and 531 between the second pass programming distributions 518, 520, 522, 524, 526, 528, 530, and 532 can be used to adjust the corresponding read level thresholds 511, 513, and 515 between the first pass programming distributions 508, 510, 512, and 514. For example, read level thresholds 529 or 531 or a combination thereof of the second pass programing 516 can correspond to read level threshold 515 of first pass programming 504. Read level thresholds 525 or 527 or a combination thereof of the second pass programing 516 can correspond to read level threshold 513 of first pass programming 504. Read level thresholds 521 or 523 or 519 or a combination thereof of the second pass programing 516 can correspond to read level threshold 511 of first pass programming 504.

In some embodiments, adjusting one or more of the read level thresholds 511, 513, and 515 includes determining the change in the one or more read level thresholds 519, 521, 523, 525, 527, 529, and 531 and adjusting one or more of the corresponding read level thresholds 511, 513, and 515 based on the determined change. In an embodiment, the corresponding read level thresholds 511, 513, and 515 can be adjusted proportional to the change in the corresponding read level thresholds 519, 521, 523, 525, 527, 529, and 531. For example, if read level threshold 529 of the second pass programming 516 is moved a positive 10 mV, then corresponding read level threshold 515 of the first pass programming 504 can be "dragged along" a proportional amount. For instance, corresponding read level threshold 515 of the first pass programming 504 can also be moved a positive 10 mV responsive to moving read level threshold 529 of the second pass programming 516 a positive 10 mV. It can be noted that proportional can mean equal in some embodiments, but can mean other than equal in other embodiments.

In other embodiments, adjusting one or more of the read level thresholds 511, 513, and 515 in a "drag along" operation can be based on satisfying one or more rules. For example, the corresponding read level thresholds 511, 513, and 515 can be adjusted proportional to the change in the corresponding read level thresholds 519, 521, 523, 525, 527, 529, and 531 responsive to determining that the adjustment in the corresponding read level thresholds 519, 521, 523, 525, 527, 529, and 531 meets or exceeds a threshold value. For instance, if the read level threshold 529 or 531 of the second pass programming 516 is adjusted greater than or equal to ±30 mV, corresponding read level threshold 515 can be adjusted proportionally. In some embodiments, one or more of the read level thresholds 511, 513, and 515 are not adjusted in a "drag along" operation if the one or more rules is not satisfied.

In some embodiments, the rules can include other criteria. For example, adjusting one or more of the read level thresholds 511, 513, and 515 in a "drag along" operation can be based on the average change of the of the corresponding read level thresholds 519, 521, 523, 525, 527, 529, and 531. For instance, if the read level threshold 529 and 531 of the second pass programming 516 is adjusted by 10 mV and 30 mV respectively, corresponding read level threshold 515 can be adjusted by the average of the change (e.g., 20 mV). In another example, adjusting one or more of the read level thresholds 511, 513, and 515 in a "drag along" operation can be based on the maximum change (or minimum change) of the of the corresponding read level thresholds 519, 521, 523, 525, 527, 529, and 531. For instance, if the read level threshold 529 and 531 of the second pass programming 516 is adjusted by 10 mV and 30 mV respectively, corresponding read level threshold 515 can be adjusted by the maximum amount the change (e.g., 30 mV). In another example, adjusting one or more of the read level thresholds 511, 513, and 515 in a "drag along" operation can be based on the change of one of the of the corresponding read level thresholds 519, 521, 523, 525, 527, 529, and 531. For instance, if the read level threshold 529 and 531 of the second pass programming 516 is adjusted by 10 mV and 30 mV respectively, corresponding read level threshold 515 can be adjusted by the either 10 mV or 30 mV. It can be appreciated that the above rules are used for purposes of illustration, rather than limitation. In other embodiments, other rules or a combination of rules can be used and can be determined based on the particular implementation. It can also be noted that a TLC (e.g. 8 programming distributions) is used for purposes of illustration, rather than limitation. Aspects of the disclosure, such as the "drag along" operation, can be applied to any multi-bit memory cell.

Figure 6:
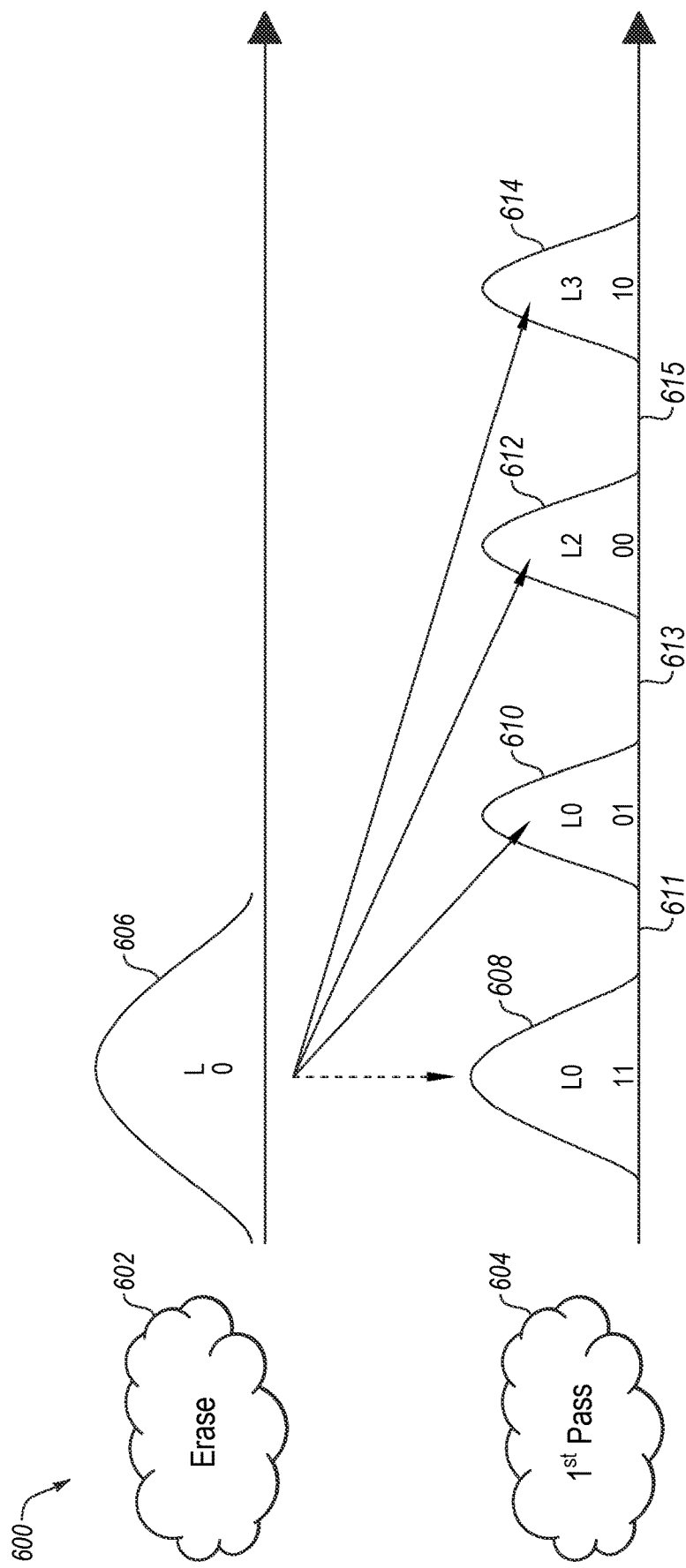
FIG. 6 illustrates a first-pass four-level programming operation with four Vt distributions in accordance with some embodiments of the disclosure.

FIG. 6 illustrates a first-pass four-level programming operation 600 with four Vt distributions, in accordance with some embodiments of the disclosure. Before a first programming pass 604, a memory cell is in an erased state 602 and has a single Vt distribution 606. The first programming pass 604 programs four levels of the memory cell, including a lower logical page and an upper logical page of a page stack. That is, after the first programming pass 604, the memory cell has four Vt distributions 608, 610, 612, 614 and three read level thresholds 611, 613, and 615. In an embodiment, once the first programming pass 604 is performed, the cRLC operation can be performed to calibrate one or more of the read level thresholds 611, 613, and 615. In one embodiment, the read level threshold 611 can be calibrated to be centered between the Vt distribution 608 and the Vt distribution 610, the read level threshold 613 can be calibrated to be centered between the Vt distribution 610 and the Vt distribution 612, and the read level threshold 615 can be calibrated to be centered between the Vt distribution 612 and the Vt distribution 614. In another embodiment, any combination of the read level thresholds 611, 613, and 615 can be calibrated and the remaining one or more of the read level thresholds 611, 613, and 615 can be programmed in other subsequent programming operations to spread out the calibration of the read level thresholds over time. To calibrate the read level threshold 611, the cRLC operation can iteratively perform a read operation on the memory cell and iteratively measure a BER of the memory cell. The cRLC operation can adjust the read level threshold based on the BER that centers the read level threshold between the Vt distribution 608 and Vt distribution 610. In another embodiment, to calibrate the read level threshold 611, the cRLC operation calculates a CenterBEC and a Diff-EC and uses these values to adjust the read level threshold 611. The read level thresholds 613 and 615 can be calibrated similarly in this same programming operation or in one or more subsequent operations as described herein. The read level thresholds 611, 613, and 615 can be adjusted to maintain minimum BER settings throughout the life of the memory cell and track variations in valley positions due to program and erase cycles, temperature, retention, or other factors. After the cRLC operation is performed to calibrate one or more of the read level thresholds 611, 613, and 615, the DPT operation is performed to calibrate two or more PV targets. After the cRLC operation and the DPT operation are performed, a subsequent programming pass can be performed (not illustrated in FIG. 6). The read level thresholds 611, 613, and 615 can have corresponding trim values for the first programming pass 604 and these values can be adjusted to achieve a specified BER setting for the respective trim. These trim values can be separate values from those used for a subsequent programming pass. In one embodiment, the cRLC operation described with respect to FIG. 6 can be used in a memory system with MLCs. Alternatively, the cRLC operation can be used in a memory system with other memory types where multi-pass programming operations are performed.

Figure 7:
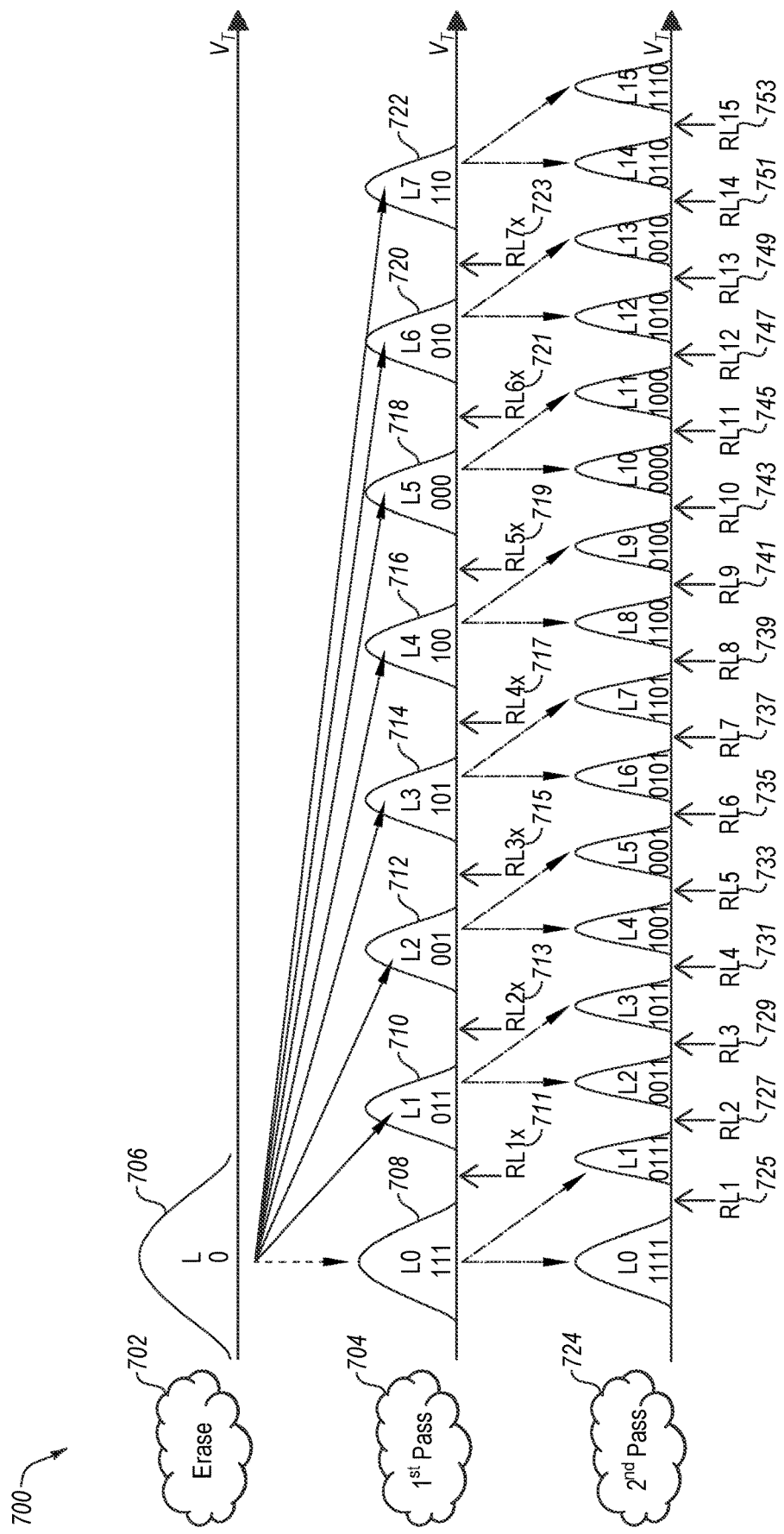
FIG. 7 illustrates a two-pass programming operation with eight-to-sixteen programming distributions and corresponding PV targets in accordance with some embodiments of the disclosure

FIG. 7 illustrates a two-pass programming operation 700 with eight-to-sixteen programming distributions and corresponding read level thresholds in accordance with some embodiments of the disclosure. Before a first programming pass 704, a memory cell is in an erased state 702 and has a single Vt distribution 706. After the first programming pass 704, the memory cell has eight Vt distributions 708, 710, 712, 714, 716, 718, 720, and 722 and seven read level thresholds 711, 713, 715, 717, 719, 721, and 723. Before a second programming pass 724, the cRLC operation can optionally be performed to calibrate one or more of the read level thresholds 711, 713, 715, 717, 719, 721, and 723. The read level thresholds 711, 713, 715, 717, 719, 721, and 723 can be adjusted to maintain minimum BER settings throughout the life of the memory cell and track variations in valley positions due to program and erase cycles, temperature, retention, or other factors. The read level thresholds 711, 713, 715, 717, 719, 721, and 723 can have corresponding trim values for the first programming pass 704 and these values can be adjusted to achieve a specified BER setting for the respective trim. Separate trims can exist for the read level thresholds of the cell after the first programming pass 704 and for the read level thresholds of the cell after the second programming pass 724.

In one embodiment, the read level threshold 711 can be calibrated to be centered between the Vt distribution 708 and the Vt distribution 810. Similarly, the read level thresholds 713-723 can be centered between the respective pairs of Vt distributions. In another embodiment, any combination of the read level thresholds 711, 713, 715, 717, 719, 721, and 723 can be calibrated and the remaining one or more of the read level thresholds 711, 713, 715, 717, 719, 721, and 723 can be programmed in other subsequent programming operations to spread out the calibration of the read level thresholds over time. To calibrate the read level threshold 711, the cRLC operation can iteratively perform a read operation on the memory cell and iteratively measure a BER of the memory cell. The cRLC operation can adjust the read level threshold based on the BER that centers the read level threshold between the Vt distribution 708 and Vt distribution 710. In another embodiment, to calibrate the read level threshold 711, the cRLC operation calculates a CenterBEC and a Diff-EC and uses these values to adjust the read level threshold 711. The read level thresholds 713-723 can be calibrated similarly in this same programming operation or in one or more subsequent operations as described herein. The read level thresholds 711, 713, 715, 717, 719, 721, and 723 can be adjusted to maintain minimum BER settings throughout the life of the memory cell and track variations in programming distribution positions due to program and erase cycles, temperature, retention, or other factors.

After the cRLC operation is performed to calibrate one or more of the read level thresholds 711, 713, 715, 717, 719, 721, and 723, the DPT operation is performed to calibrate two or more PV targets corresponding to two or more of the programming distributions. After the cRLC operation and the DPT operation are performed, the second programming pass 724 can be performed. After the second programming pass, the memory cell has sixteen Vt distributions (not all individually labeled) and fifteen read level thresholds 725, 727, 729, 731, 733, 735, 737, 739, 741, 743, 745, 747, 749, 751, and 753. The second programming pass 724 uses the data stored at the memory cell that was programmed during the first programming pass 704. In another embodiment, another cRLC operation can be performed to calibrate one or more of the eight read level thresholds after the second programming pass 724, such as before a third programming pass. That is, the cRLC operation can be performed before each subsequent programming pass operation in a multi-pass programming sequence.

In some implementations, cRLC "drag along" can be implemented as described herein. In some embodiments, after the read level thresholds 725, 727, 729, 731, 733, 735, 737, 739, 741, 743, 745, 747, 749, 751, and 753 of the second pass programming 724 have been calibrated or converged, further adjustments to the read level thresholds 725, 727, 729, 731, 733, 735, 737, 739, 741, 743, 745, 747, 749, 751, and 753 can be made. The changes to one or more of the read level thresholds 725, 727, 729, 731, 733, 735, 737, 739, 741, 743, 745, 747, 749, 751, and 753 can be used to adjust one or more corresponding read level thresholds 711, 713, 715, 717, 719, 721, and 723 (e.g., adjust the default trim values) between the first pass programming distributions 708, 710, 712, 714, 716, 718, 720, and 722. Such action can be considered a cRLC "drag along" where adjustments to the read level thresholds 725, 727, 729, 731, 733, 735, 737, 739, 741, 743, 745, 747, 749, 751, and 753 between the second pass programming distributions (not numbered) are used to adjust or make decisions about adjustment of the read level thresholds 711, 713, 715, 717, 719, 721, and 723 between the first pass programming distributions 708, 710, 712, 714, 716, 718, 720, and 722.

In an embodiment, some of the read level thresholds 725, 727, 729, 731, 733, 735, 737, 739, 741, 743, 745, 747, 749, 751, and 753 between the second pass programming distributions can correspond to respective ones of the read level thresholds 711, 713, 715, 717, 719, 721, and 723 between the first pass programming distributions 708, 710, 712, 714, 716, 718, 720, and 722 so that adjustments made to the particular read level thresholds 725, 727, 729, 731, 733, 735, 737, 739, 741, 743, 745, 747, 749, 751, and 753 between the second pass programming distributions can be used to adjust the corresponding read level thresholds 711, 713, 715, 717, 719, 721, and 723 between the first pass programming distributions 708, 710, 712, 714, 716, 718, 720, and 722. For example, read level thresholds 751 or 753 or a combination thereof of the second pass programing 724 can correspond to read level threshold 723 of first pass programming 704. Read level thresholds 747 or 749 or a combination thereof of the second pass programing 724 can correspond to read level threshold 721 of first pass programming 701. Read level thresholds 745 or 743 or a combination thereof of the second pass programing 724 can correspond to read level threshold 719 of first pass programming 704. Read level thresholds 739 or 741 or a combination thereof of the second pass programing 724 can correspond to read level threshold 717 of first pass programming 704. Read level thresholds 735 or 737 or a combination thereof of the second pass programing 724 can correspond to read level threshold 715 of first pass programming 704. Read level thresholds 735 or 737 or a combination thereof of the second pass programing 724 can correspond to read level threshold 715 of first pass programming 704. Read level thresholds 731 or 733 or a combination thereof of the second pass programing 724 can correspond to read level threshold 713 of first pass programming 704. Read level thresholds 725. 727, or 729 or a combination thereof of the second pass programing 724 can correspond to read level threshold 711 of first pass programming 704. In embodiments, rules, such as the rules described with respect to FIG. 5, can be applied in a similar manner.

Figure 8:
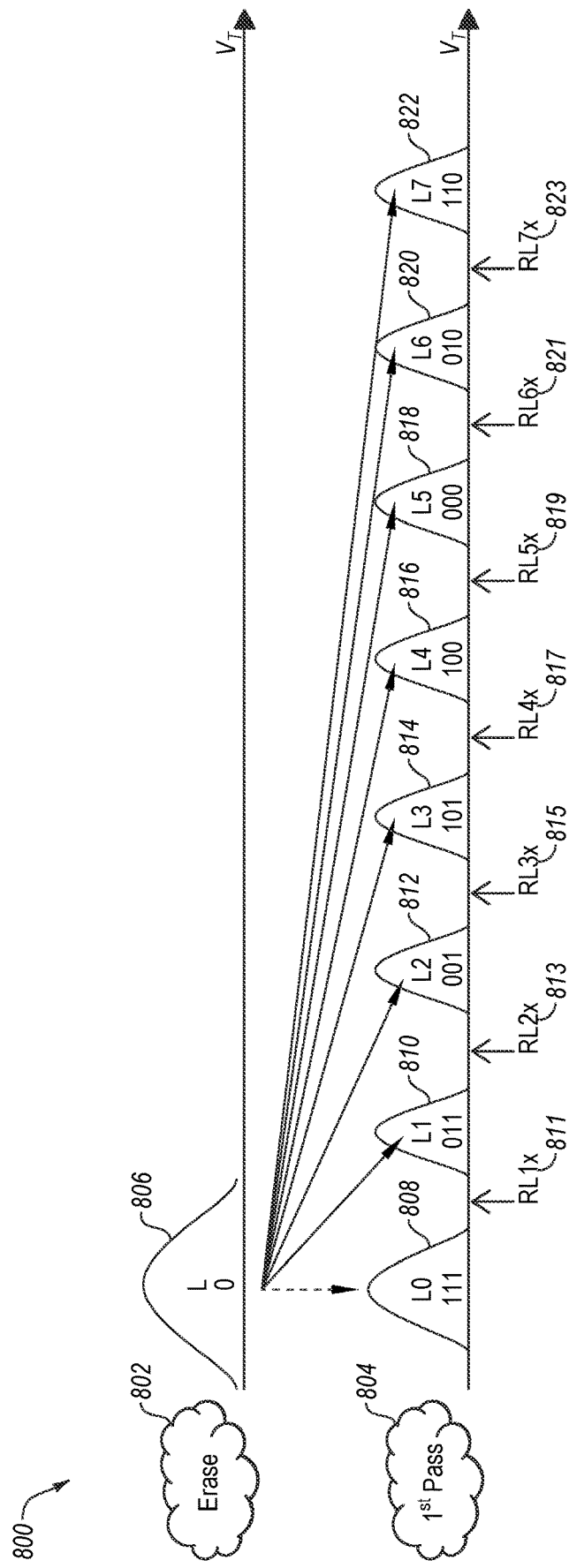
FIG. 8 illustrates a first-pass eight-level programming operation with eight Vt distributions in accordance with some embodiments of the disclosure.

FIG. 8 illustrates a first-pass eight-level programming operation 800 with eight Vt distributions in accordance with some embodiments of the disclosure. Before a first programming pass 804, a memory cell is in an erased state 802 and has a single Vt distribution 806. The first programming pass 804 programs eight levels of the memory cell, including a lower logical page, an upper logical page, and an extra logical page of a page stack. That is, after the first programming pass 804, the memory cell has eight Vt distributions 808, 810, 812, 814, 816, 818, 820, and 822 and seven read level thresholds 811, 813, 815, 817, 819, 821, and 823. Once the first programming pass 804 is performed, the cRLC operation can be performed to calibrate one or more of the read level thresholds 811, 813, 815, 817, 819, 821, and 823. After the cRLC operation is performed to calibrate one or more of the read level thresholds 811, 813, 815, 817, 819, 821, and 823, the DPT operation is performed to calibrate two or more PV targets corresponding to two or more of the programming distributions.

In one embodiment, the read level threshold 811 can be calibrated to be centered between the Vt distribution 808 and the Vt distribution 810. Similarly, the read level thresholds 813, 815, 817, 819, 821, and 823 can be centered between the respective pairs of Vt distributions 810-822. In another embodiment, any combination of the read level thresholds 811, 813, 815, 817, 819, 821, and 823 can be calibrated and the remaining one or more of the read level thresholds 811, 813, 815, 817, 819, 821, and 823, if any, can be programmed in other subsequent programming operations to spread out the calibration of the read level thresholds over time. To calibrate the read level threshold 811, the cRLC operation can iteratively perform a read operation on the memory cell and iteratively measure a BER of the memory cell. The cRLC operation can adjust the read level threshold based on the BER that centers the read level threshold between the Vt distribution 808 and Vt distribution 810. In another embodiment, to calibrate the read level threshold 811, the cRLC operation calculates a CenterBEC and a Diff-EC and uses these values to adjust the read level threshold 811. The read level thresholds 813, 815, 817, 819, 821, and 823 can be calibrated similarly in this same programming operation or in one or more subsequent operations as described herein. The read level thresholds 811, 813, 815, 817, 819, 821, and 823 can be adjusted to maintain minimum BER settings throughout the life of the memory cell and track variations in valley positions due to program/erase cycles, temperature, retention, or other factors.

After the cRLC operation and the DPT operation are performed to calibrate one or more of the read level thresholds 811, 813, 815, 817, 819, 821, and 823, a subsequent programming pass can be performed (not illustrated in FIG. 8). The read level thresholds 811, 813, 815, 817, 819, 821, and 823 can have corresponding trim values for the first programming pass 804 and these values can be adjusted to achieve a specified BER setting for the respective trim. These trim values can be separate values from those used for a subsequent programming pass.

In one embodiment, the cRLC operation described with respect to FIG. 8 can be used in a memory system with MLCs. Alternatively, the cRLC operation can be used in a memory system with other memory types where multi-pass programming operations are performed.

Figure 9:
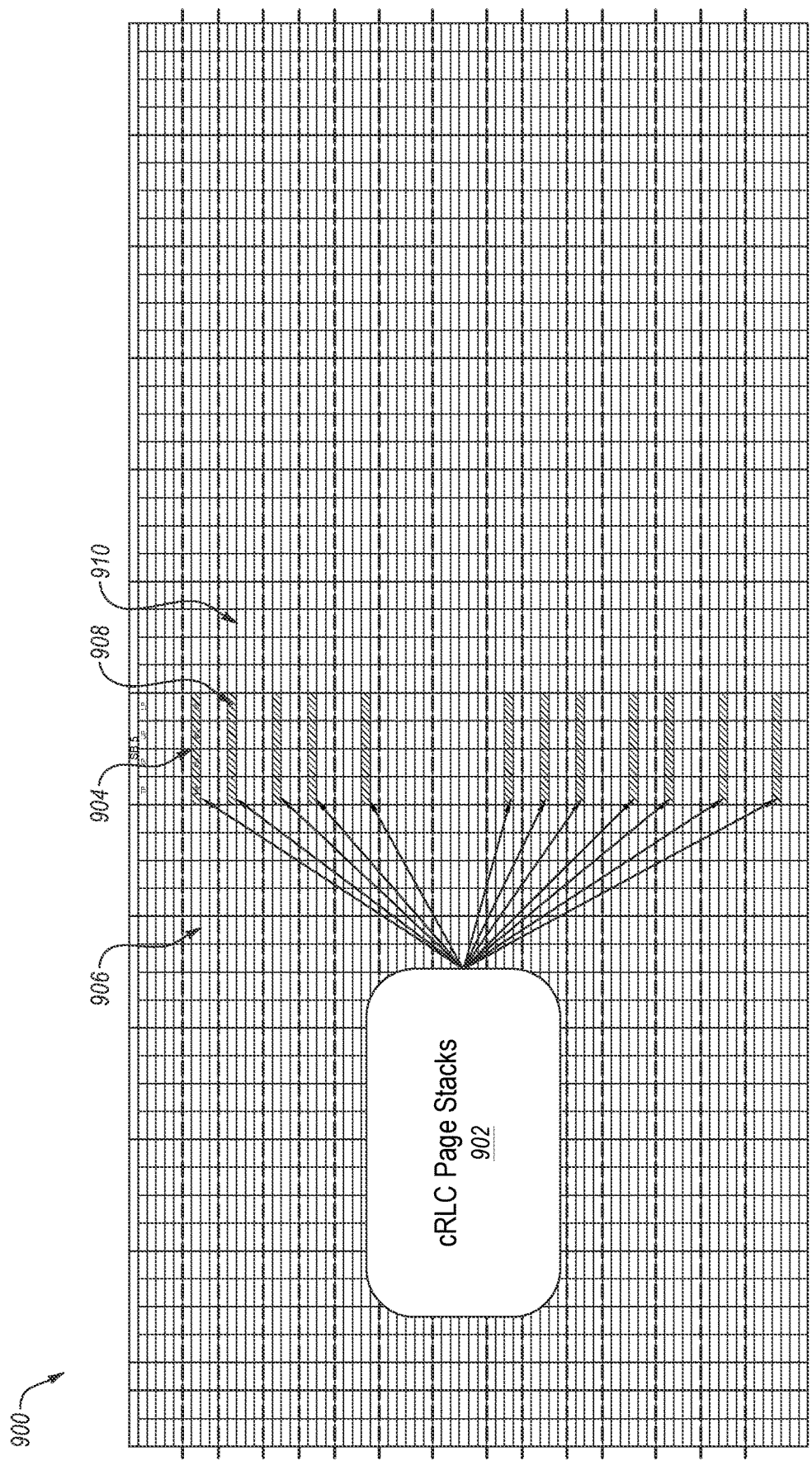
FIG. 9 is a page map of a memory block for a full block program operation with multiple CRLC page stacks in accordance with some embodiments of the disclosure.

FIG. 9 is a page map 900 of a memory block for a full block program operation with multiple cRLC page stacks in accordance with some embodiments of the disclosure. The page map 900 is a programming operation page map for a memory component having 38 wordlines (WL) per block and 9 wordline groups (WLGs) per block. The page map 900 can include sixteen sub-blocks in each block, where each sub-block of each WLG contains just one page type (e.g., LP, UP, XP, TP). The memory block can include SLC pages in the first and last WLGs, MLC pages in the second and second-to-last WLGs, and TLC pages in the intervening WLGs. Each read trim can be an N-bit offset register within the block. For example, an 8-bit offset register could be used where 7 bits are the magnitude and 1 bit is the sign convention. For each trim type, there can be a base trim value so that the offset trims for each page type are a +/− offset value relative to the base value. The offset value can correspond to the resolution of the trim.

During programming of the memory block selected for a cRLC operation, a block programming sequence is interrupted to perform cRLC. The programming interruption occurs at each page stack selected as one of the cRLC page stacks 902. The program interruption occurs just before a subsequent programming pass when the programming distributions from a previous programming operation have fully aggressed floating gate coupling from their neighbors. During block programming, each of the cRLC page stacks 902 in each of the wordline groups is interrupted and a cRLC is performed until all valleys of the page stack are centered with minimum error rate. For example, during block programming the selected block, a first sample cRLC page stack 904 in a first wordline group 906 is interrupted and a cRLC operation is performed until all valleys (read level thresholds) of the first sample cRLC page stack 904 are centered with minimum error rate. Similarly, during block programming the selected block, a second cRLC page stack 908 in a second wordline group 910 is interrupted and a cRLC operation is performed until all valleys (read level thresholds) of the second sample cRLC page stack 908 are centered with minimum error rate. In one embodiment, the full cRLC operation is run until all trims within the first sample cRLC page stack 904 are confirmed to be at their minimum BER settings. Similarly, for the second sample cRLC page stack 908, the full cRLC operation is run until all trims are confirmed to be at their minimum BER settings. In another embodiment, the cRLC sampling and convergence to minimum BER settings is spread out over many programming operations. For example only one trim within the first sample cRLC page stack 904 gets one cRLC sample on a given block programming. The next block to be programmed would get the next cRLC sample for that trim and so on until enough blocks are programmed that all trims are converged to their minimum BER settings.

It should be noted that when used with the DPT operation, the cRLC information from each valley is passed to the DPT operation for determining PV target modifications. The cRLC information can include CenterBEC, Diff-EC, other metrics, or the like.

Figure 10:
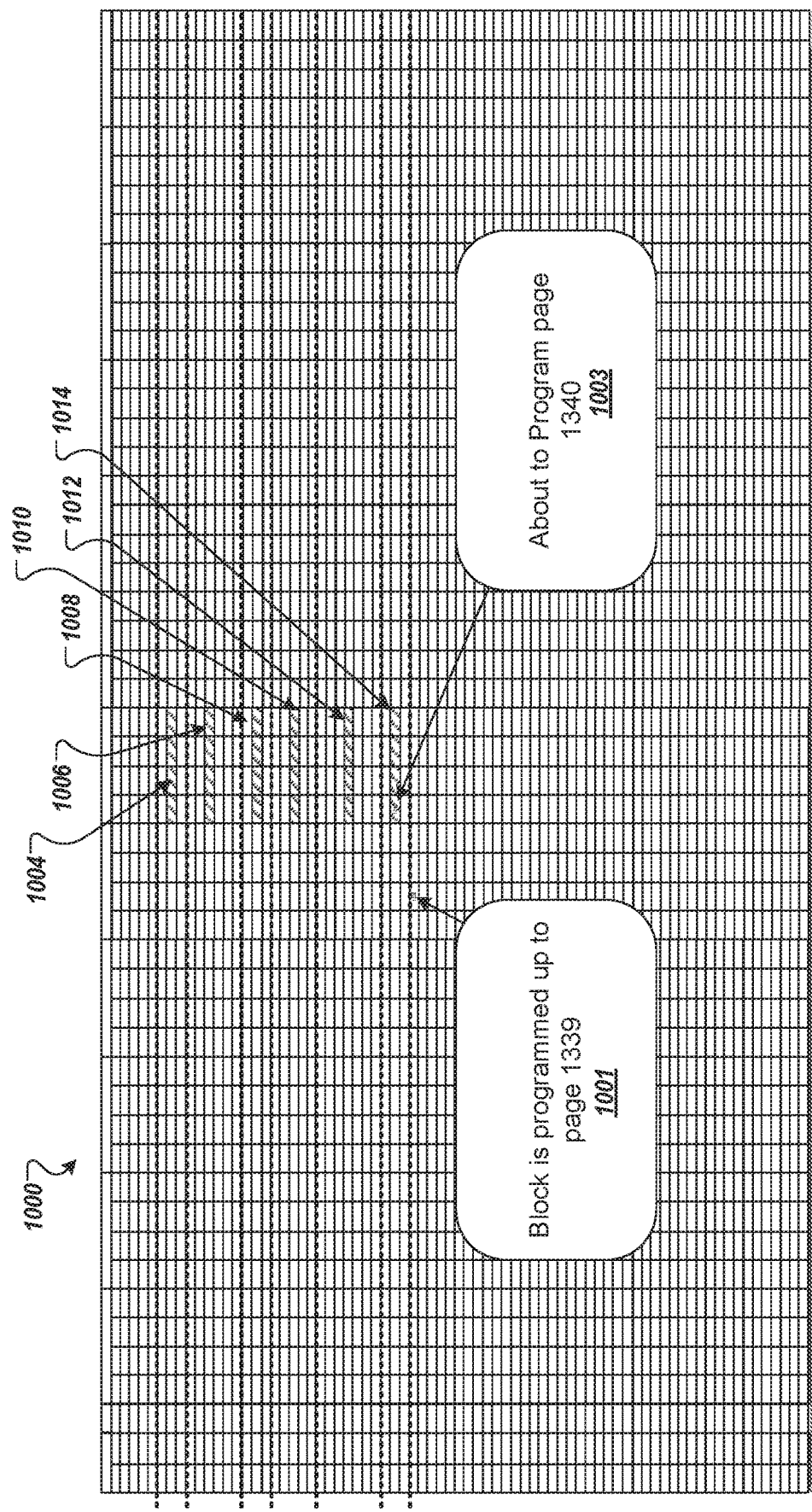
FIG. 10 is a page map of a memory block for a partial block program operation in accordance with some embodiments of the disclosure.

FIG. 10 is a page map 1000 of a memory block for a partial block program operation in accordance with some embodiments of the disclosure. During programming of the memory block selected for a cRLC operation, a block programming sequence of the block is programmed up to a specified page 1001, such as logical page 1339 as illustrated in FIG. 10. The block programming sequence is interrupted just before programming a next logical page 1003 of the corresponding logical page, such as the Top Logical Page 1340 as illustrated in FIG. 10. At this point, and at each of the other cRLC page stacks 1004-1014, the cRLC operation is allowed to fully converge the read level thresholds to become "centered" before the programming sequence is resumed. As described herein, the cRLC information can be passed on to DPT to perform its rule based modification of the associated PV trims for the next programming operation.

Figure 11:
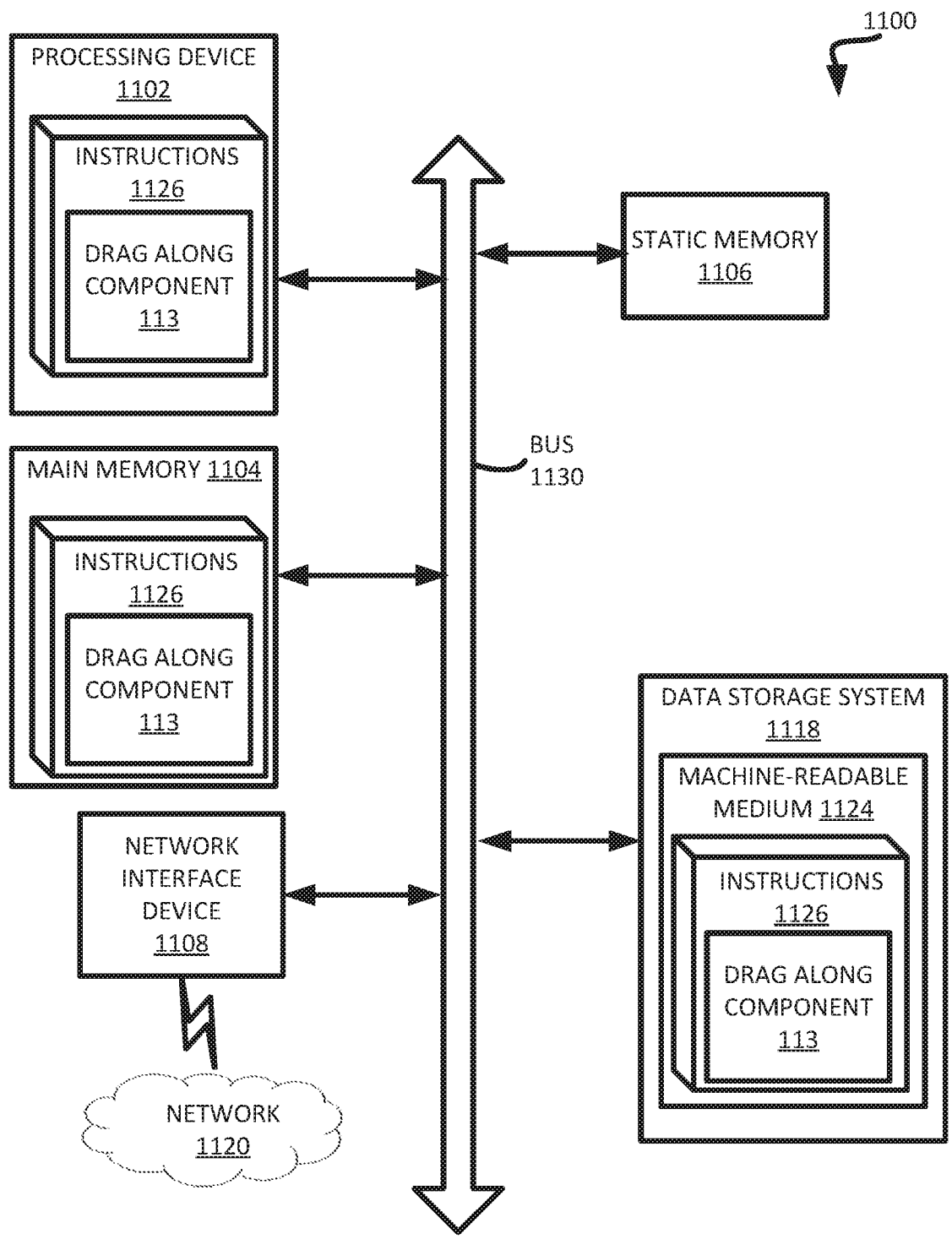
FIG. 11 is a block diagram of an example computer system in which embodiments of the disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the drag along component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a non-transitory computer-readable storage medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to the drag along component 113 of FIG. 1. While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of algorithms, operations, and symbolic representations of operations on data bits within a computer memory. These algorithmic or operation descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled to the memory device, to perform operations comprising:
   performing a multi-pass programming operation on the memory device resulting in first pass programming distributions and second pass programming distributions;
   changing one or more read level thresholds between the second pass programming distributions; and
   responsive to changing the one or more read level thresholds between the second pass programming distributions, adjusting one or more read level thresholds between the first pass programming distributions based on the changes to the one or more read level thresholds between the second pass programming distributions.

2. The system of claim 1, wherein changing the one or more read level thresholds between the second pass programming distributions, comprises:
   performing a calibration operation on the memory device to calibrate the one or more read level thresholds between the second pass programming distributions, wherein the calibration operation adjusts the one or more read level thresholds between the second pass programming distributions to a center value that results in a lowest bit error rate.

3. The system of claim 1, wherein adjusting the one or more read level thresholds between the first pass programming distributions based on the changes to the one or more read level thresholds between the second pass programming distributions, comprises:
   determining the changes in the one or more read level thresholds between the second pass programming distributions; and
   adjusting the one or more read level thresholds between the first pass programming distributions based on the determined changes in the one or more read level thresholds between the second pass programming distributions.

4. The system of claim 3, wherein the one or more read level thresholds between the first pass programming distributions are adjusted proportionally to the changes in the one or more read level thresholds between the second pass programing distributions.

5. The system of claim 3, wherein adjusting the one or more read level thresholds between the first pass programming distributions based on the changes to the one or more read level thresholds between the second pass programming distributions comprises:

determining whether the changes to the one or more read level thresholds between the second pass programming distributions satisfies a rule, wherein the one or more read level thresholds between the first pass programming distributions are adjusted responsive to determining that the changes in the one or more read level thresholds between the second pass programming distributions satisfies the rule.

6. The system of claim 1, the operations further comprising:
programming the memory device with default read level thresholds to establish the read level thresholds between the first pass programming distributions.

7. The system of claim 1, wherein a number of first pass programming distributions is less than or equal to a number of second pass programming distributions.

8. The system of claim 2, wherein the calibration operation on the memory device to calibrate the read level thresholds between the first pass programming distributions is not performed between a performance of a first programming pass and a second programming pass of the multi-pass programming operation.

9. A method, comprising:
performing a multi-pass programming operation on a memory device resulting in first pass programming distributions and second pass programming distributions;
changing one or more read level thresholds between the second pass programming distributions; and
responsive to changing the one or more read level thresholds between the second pass programming distributions, adjusting one or more read level thresholds between the first pass programming distributions based on the changes to the one or more read level thresholds between the second pass programming distributions.

10. The method of claim 9, wherein changing the one or more read level thresholds between the second pass programming distributions, comprises:
performing a calibration operation on the memory device to calibrate the one or more read level thresholds between the second pass programming distributions, wherein the calibration operation adjusts the one or more read level thresholds between the second pass programming distributions to a center value that results in a lowest bit error rate.

11. The method of claim 9, wherein adjusting the one or more read level thresholds between the first pass programming distributions based on the changes to the one or more read level thresholds between the second pass programming distributions, comprises:
determining the changes in the one or more read level thresholds between the second pass programming distributions; and
adjusting the one or more read level thresholds between the first pass programming distributions based on the determined changes in the one or more read level thresholds between the second pass programming distributions.

12. The method of claim 11, wherein the one or more read level thresholds between the first pass programming distributions are adjusted proportionally to the changes in the one or more read level thresholds between the second pass programing distributions.

13. The method of claim 11, wherein adjusting the one or more read level thresholds between the first pass programming distributions based on the changes to the one or more read level thresholds between the second pass programming distributions comprises:
determining whether the changes to the one or more read level thresholds between the second pass programming distributions satisfies a rule, wherein the one or more read level thresholds between the first pass programming distributions are adjusted responsive to determining that the changes in the one or more read level thresholds between the second pass programming distributions satisfies the rule.

14. The method of claim 9, wherein a number of first pass programming distributions is less than or equal to a number of second pass programming distributions.

15. The method of claim 10, wherein the calibration operation on the memory device to calibrate the read level thresholds between the first pass programming distributions is not performed between a performance of a first programming pass and a second programming pass of the multi-pass programming operation.

16. A non-transitory computer-readable medium comprising instructions that, responsive to execution by a processing device, cause the processing device to perform operations comprising:
performing a multi-pass programming operation on a memory device resulting in first pass programming distributions and second pass programming distributions;
changing one or more read level thresholds between the second pass programming distributions; and
responsive to changing the one or more read level thresholds between the second pass programming distributions, adjusting one or more read level thresholds between the first pass programming distributions based on the changes to the one or more read level thresholds between the second pass programming distributions.

17. The non-transitory computer-readable medium of claim 16, wherein changing the one or more read level thresholds between the second pass programming distributions, comprises:
performing a calibration operation on the memory device to calibrate the one or more read level thresholds between the second pass programming distributions, wherein the calibration operation adjusts the one or more read level thresholds between the second pass programming distributions to a center value that results in a lowest bit error rate.

18. The non-transitory computer-readable medium of claim 16, wherein adjusting the one or more read level thresholds between the first pass programming distributions based on the changes to the one or more read level thresholds between the second pass programming distributions, comprises:
determining the changes in the one or more read level thresholds between the second pass programming distributions; and
adjusting the one or more read level thresholds between the first pass programming distributions based on the determined changes in the one or more read level thresholds between the second pass programming distributions.

19. The non-transitory computer-readable medium of claim 18, wherein the one or more read level thresholds between the first pass programming distributions are adjusted proportionally to the changes in the one or more read level thresholds between the second pass programing distributions.

20. The non-transitory computer-readable medium of claim 18, wherein adjusting the one or more read level thresholds between the first pass programming distributions based on the changes to the one or more read level thresholds between the second pass programming distributions comprises:

determining whether the changes to the one or more read level thresholds between the second pass programming distributions satisfies a rule, wherein the one or more read level thresholds between the first pass programming distributions are adjusted responsive to determining that the changes in the one or more read level thresholds between the second pass programming distributions satisfies the rule.

\* \* \* \* \*